(12) United States Patent
Kim et al.

(10) Patent No.: US 11,882,719 B2
(45) Date of Patent: *Jan. 23, 2024

(54) DISPLAY DEVICE

(71) Applicant: LG ELECTRONICS INC., Seoul (KR)

(72) Inventors: Chulki Kim, Seoul (KR); Chunsoo Chang, Seoul (KR); Dabin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/863,851

(22) Filed: Jul. 13, 2022

(65) Prior Publication Data

US 2022/0352484 A1    Nov. 3, 2022

Related U.S. Application Data

(63) Continuation of application No. 16/768,250, filed as application No. PCT/KR2018/006101 on May 29, 2018, now Pat. No. 11,398,615.

(30) Foreign Application Priority Data

Nov. 30, 2017    (KR) .................. 10-2017-0163422

(51) Int. Cl.
*H05K 5/00*    (2006.01)
*H10K 50/84*    (2023.01)

(52) U.S. Cl.
CPC .......... *H10K 50/84* (2023.02); *H05K 5/0017* (2013.01)

(58) Field of Classification Search
USPC ............... 361/807, 728, 752, 800, 809, 810
See application file for complete search history.

(56) References Cited

U.S. PATENT DOCUMENTS

| 4,567,546 | A  | 1/1986  | Zeller et al. |
| 6,744,186 | B2 | 6/2004  | Oishi et al.  |
| 7,447,034 | B2 | 11/2008 | Shin          |

(Continued)

FOREIGN PATENT DOCUMENTS

| JP | 2010145805    | 7/2010 |
| KR | 1020060069569 | 6/2006 |

(Continued)

OTHER PUBLICATIONS

PCT International Application No. PCT/KR2018/006101, International Search Report dated Sep. 3, 2018, 3 pages.

(Continued)

*Primary Examiner* — Hung S. Bui
(74) *Attorney, Agent, or Firm* — LEE, HONG, DEGERMAN, KANG & WAIMEY

(57) ABSTRACT

The present disclosure provides a display device including a display panel, a main frame positioned behind the display panel, an inner plate positioned between the display panel and the main frame, a support plate mounted on a back surface of the display panel and facing the inner plate, and a coupling member for coupling the inner plate and the support plate, wherein the coupling member includes a first coupling member mounted on the support plate, and a second coupling member mounted on the inner plate and coupled to the first coupling member.

17 Claims, 18 Drawing Sheets

(56) References Cited

U.S. PATENT DOCUMENTS

| | | | |
|---|---|---|---|
| 7,463,490 B2 | 12/2008 | Kim et al. | |
| 8,320,119 B2 | 11/2012 | Isoshima et al. | |
| 10,779,419 B2* | 9/2020 | Giorio | H05K 5/0204 |
| 11,398,615 B2* | 7/2022 | Kim | H05K 5/0017 |
| 2002/0171774 A1 | 11/2002 | Lee | |
| 2012/0194499 A1* | 8/2012 | Tanaka | H05K 7/20972 |
| | | | 345/211 |
| 2013/0321715 A1 | 12/2013 | Millson et al. | |
| 2015/0373857 A1* | 12/2015 | Chikazawa | H04N 5/66 |
| | | | 361/679.01 |
| 2017/0105297 A1 | 4/2017 | Han | |
| 2021/0202892 A1 | 7/2021 | Kim et al. | |

FOREIGN PATENT DOCUMENTS

| | | |
|---|---|---|
| KR | 20110005510 | 1/2011 |
| KR | 1020120130519 | 12/2012 |
| KR | 1020130088534 | 8/2013 |
| KR | 10-2016-0075236 | 6/2016 |
| KR | 20170042893 | 4/2017 |

OTHER PUBLICATIONS

Korean Intellectual Property Office Application No. 10-2017-0163422, Office Action dated Nov. 22, 2021, 6 pages.
United States Patent and Trademark Office U.S. Appl. No. 16/768,250, Office Action dated Dec. 9, 2021, 11 pages.
Korean Intellectual Property Office Application No. 10-2022-0103565, Office Action dated Nov. 7, 2022, 6 pages.

* cited by examiner

[FIG. 1]
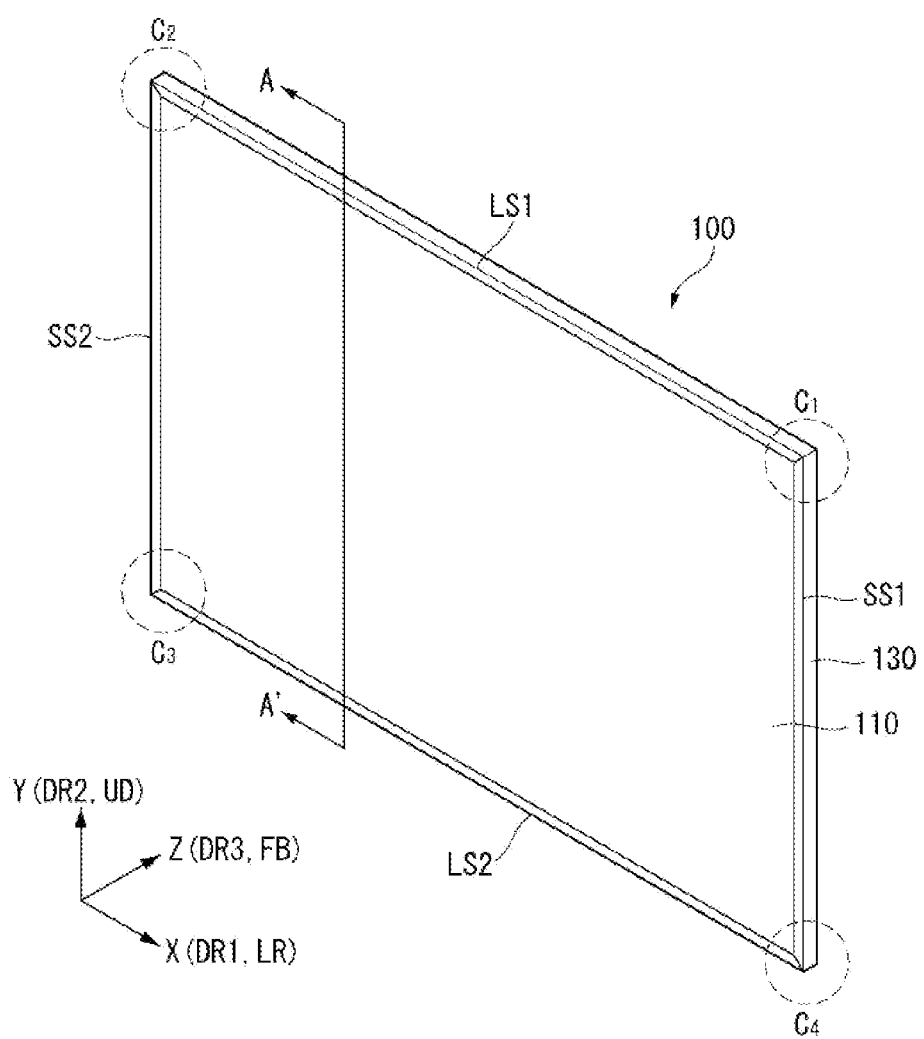

[FIG. 2]
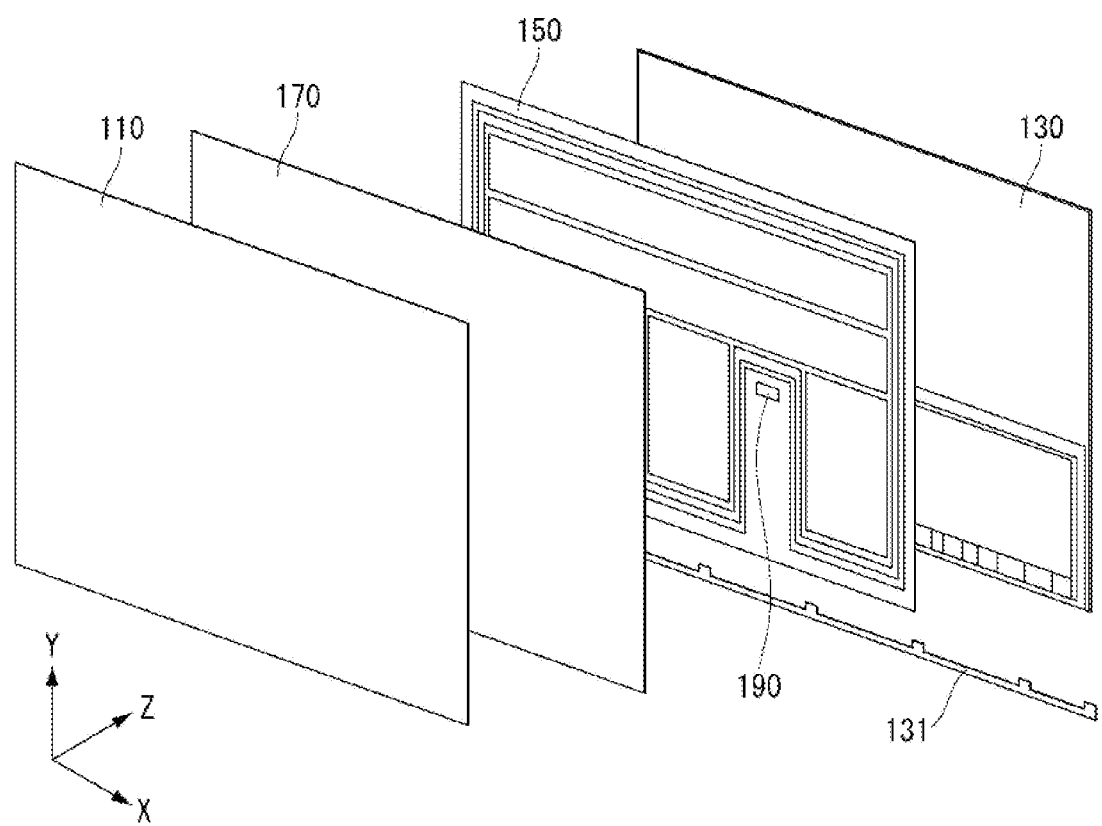

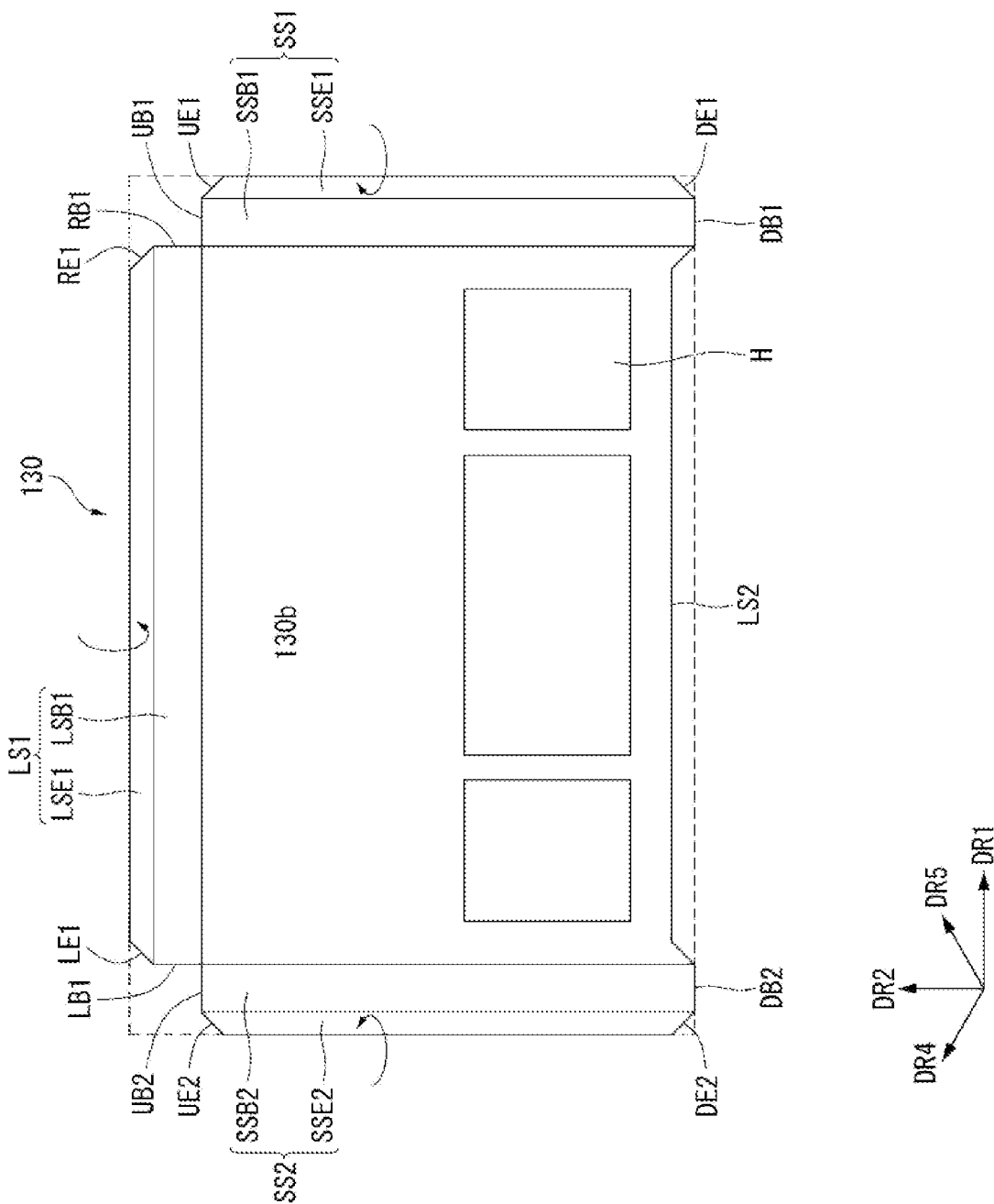
[FIG. 3]

[FIG. 4]
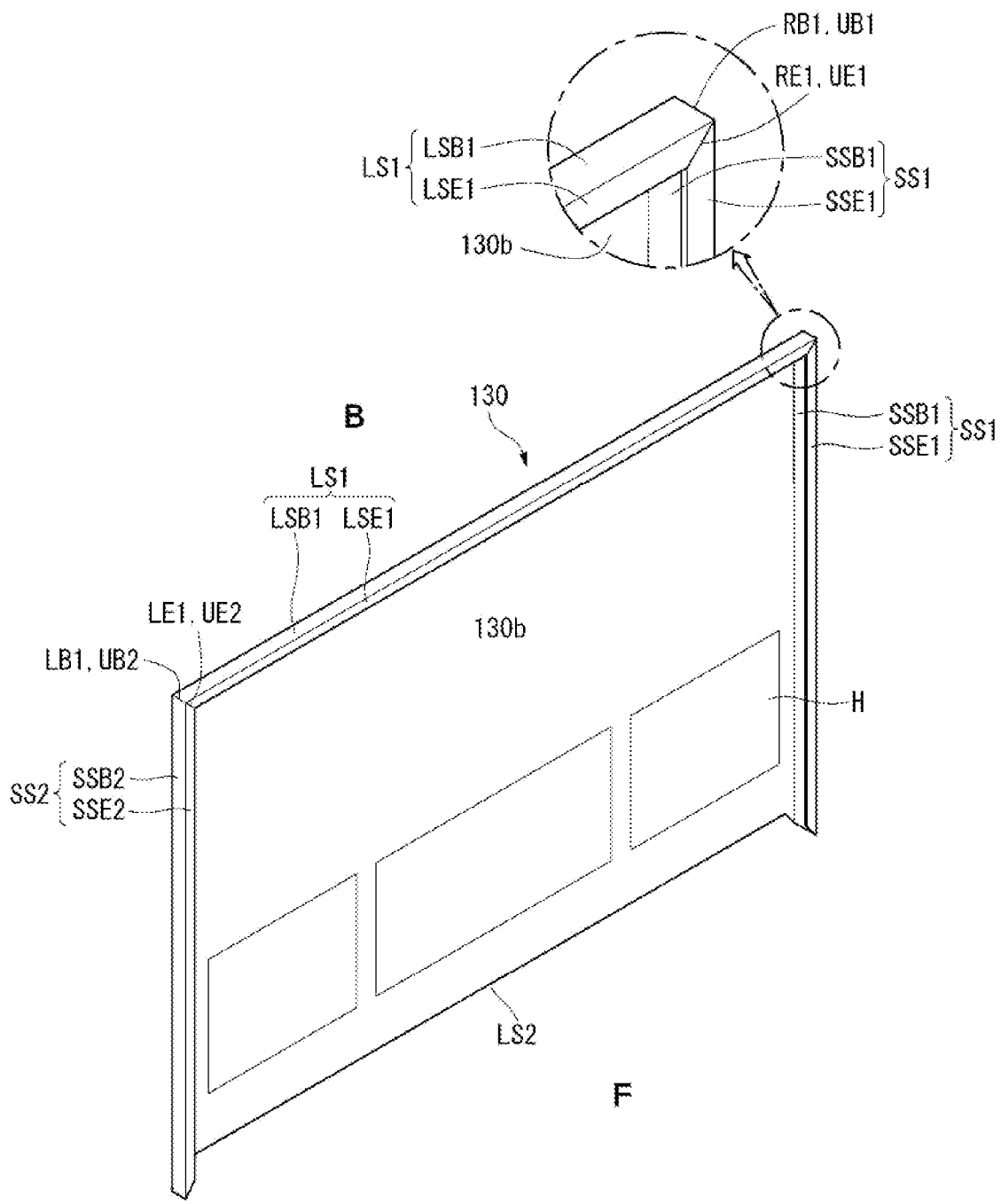

【FIG. 5】
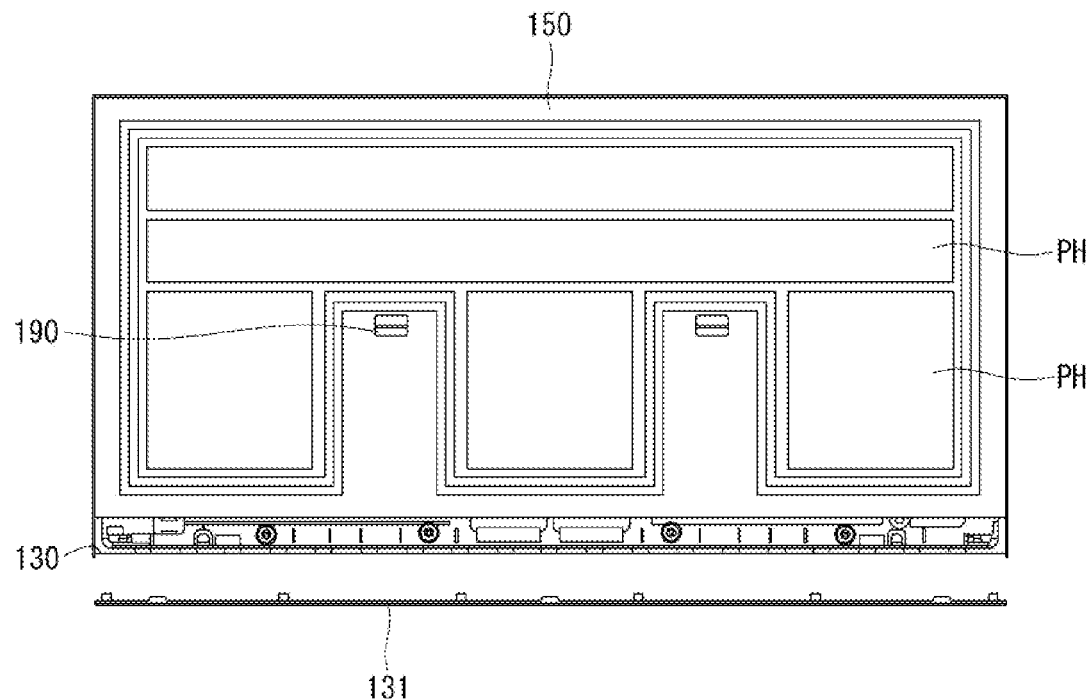
【FIG. 6a】
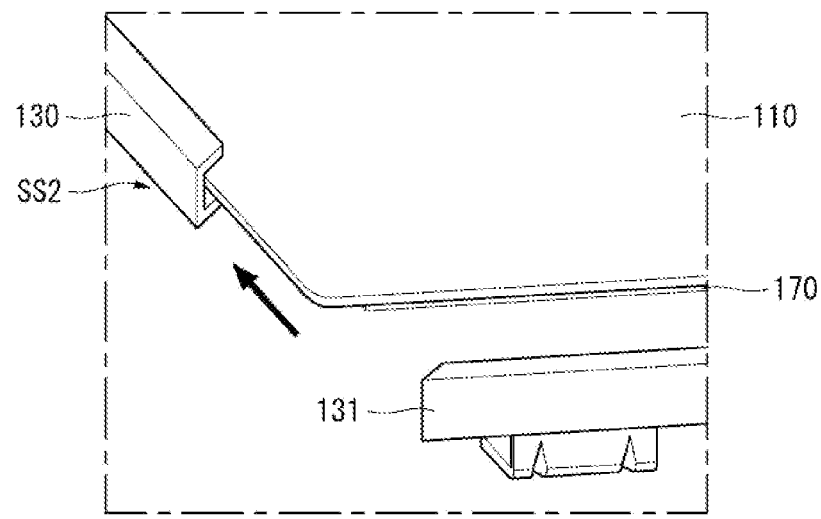

[FIG. 6b]
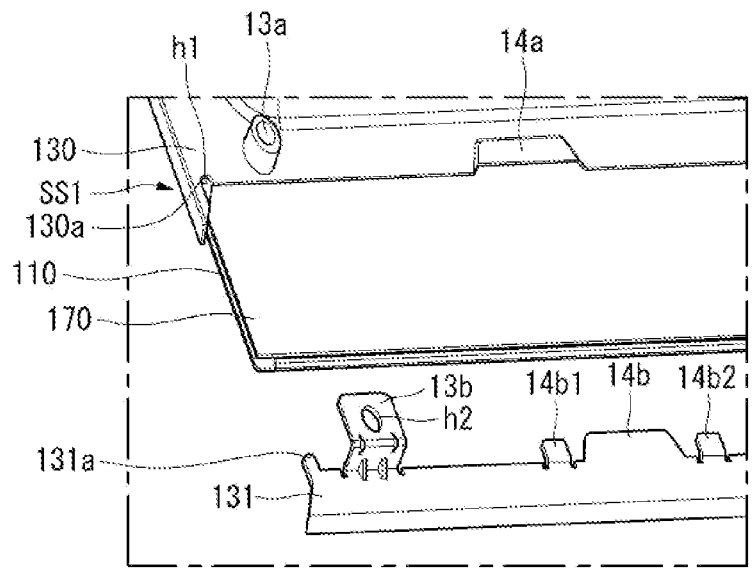
[FIG. 7]
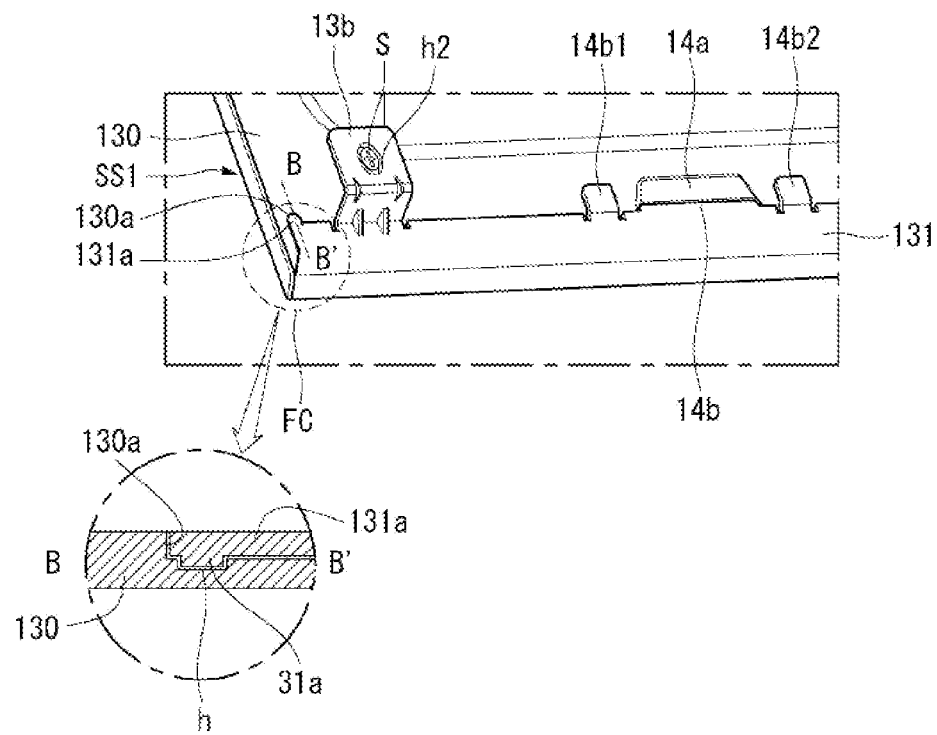

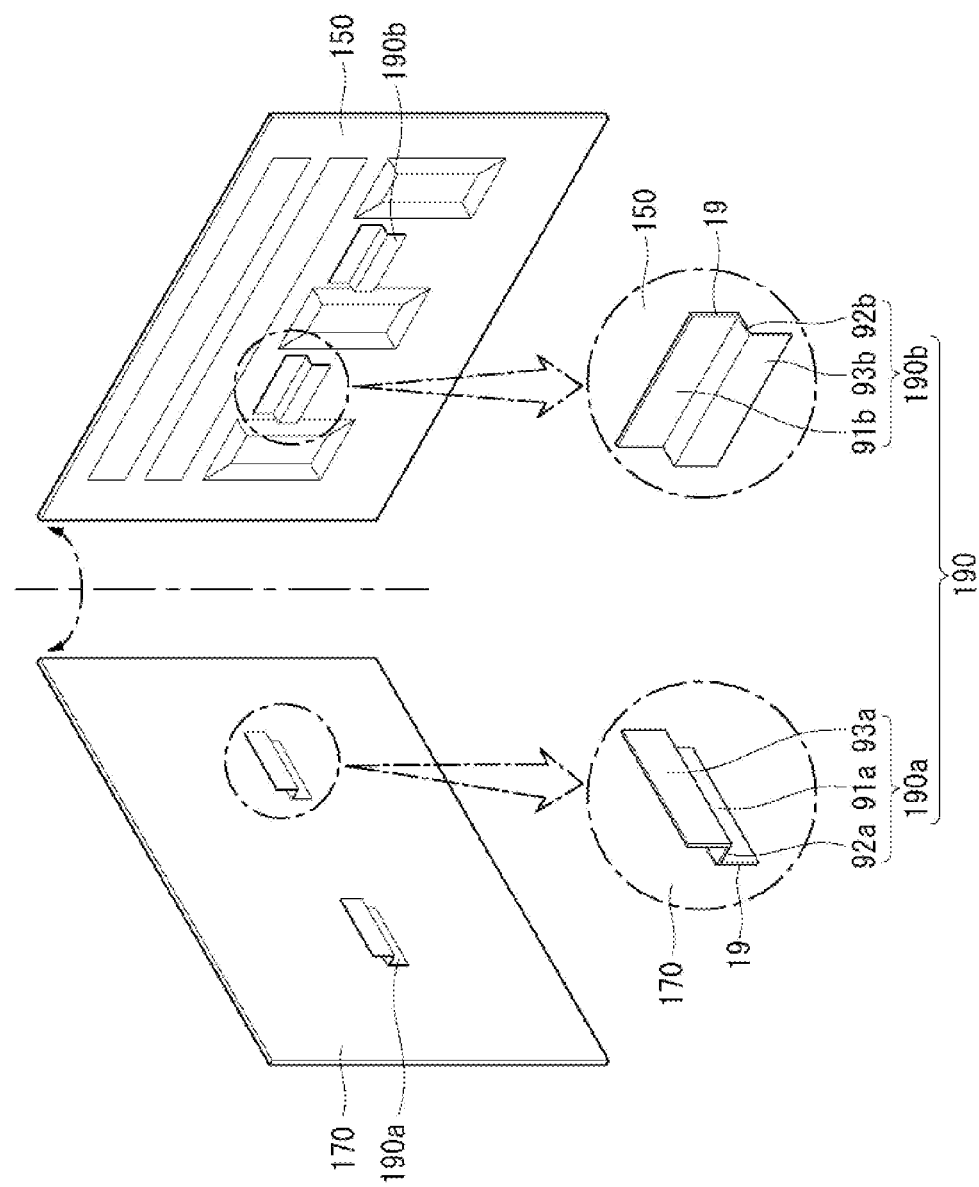
[FIG. 8]

[FIG. 9]
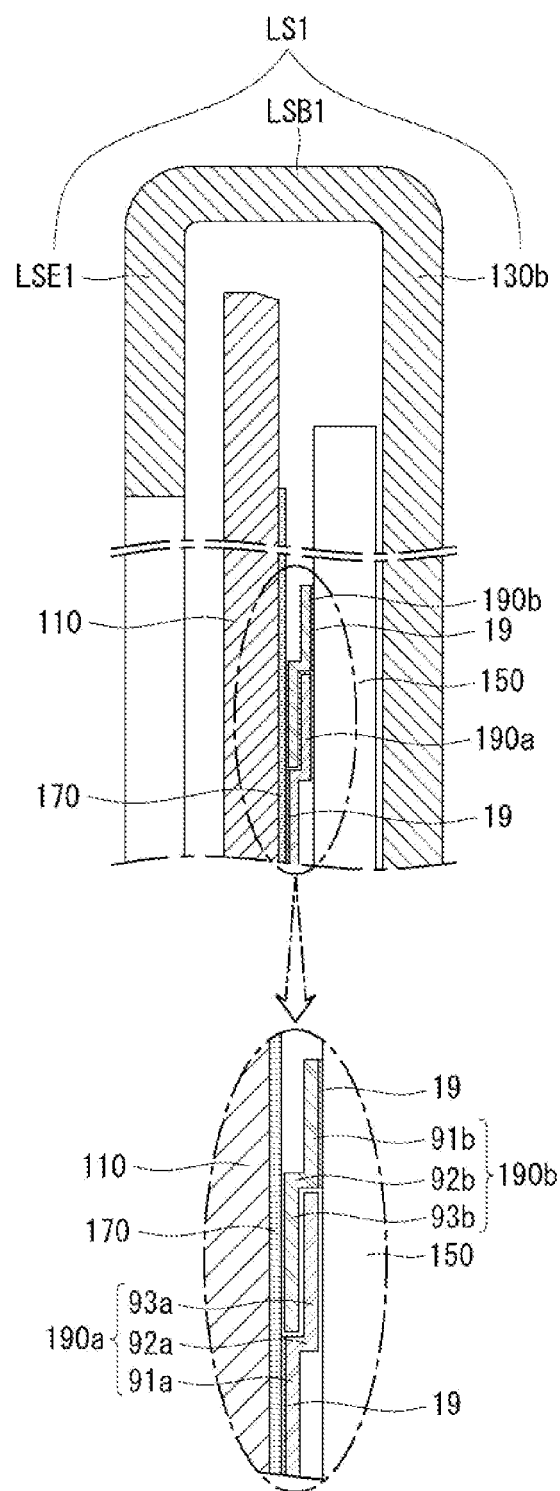

[FIG. 10]
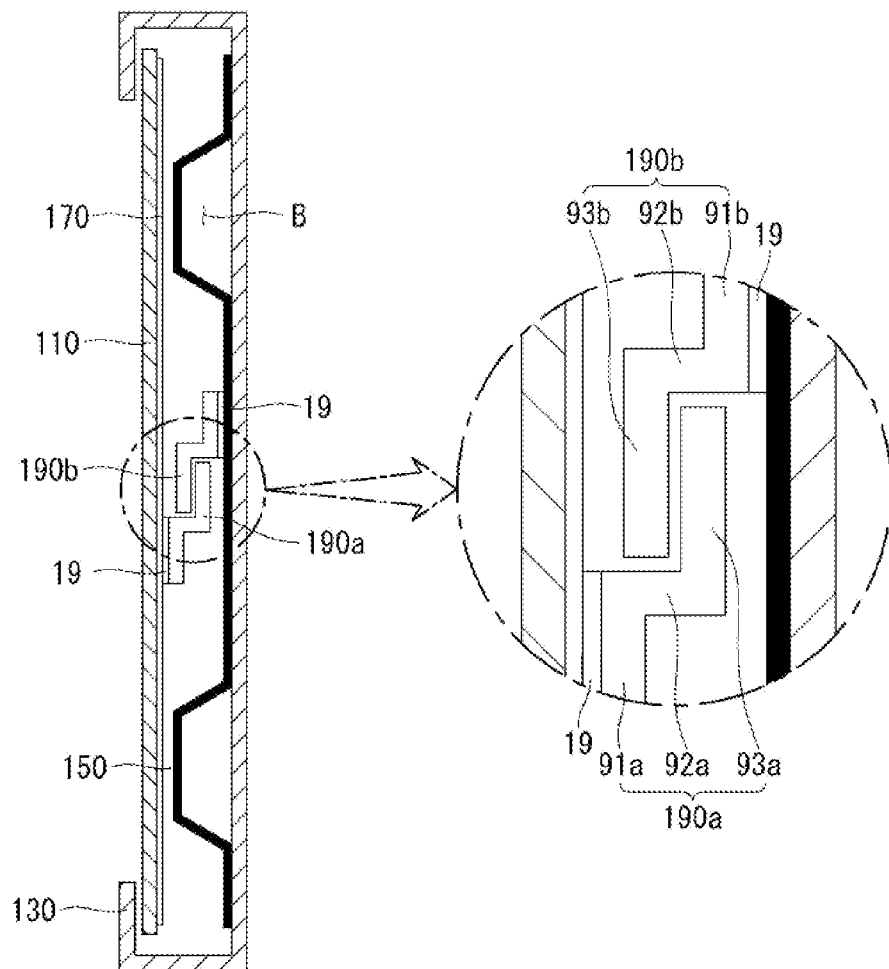

[FIG. 11]
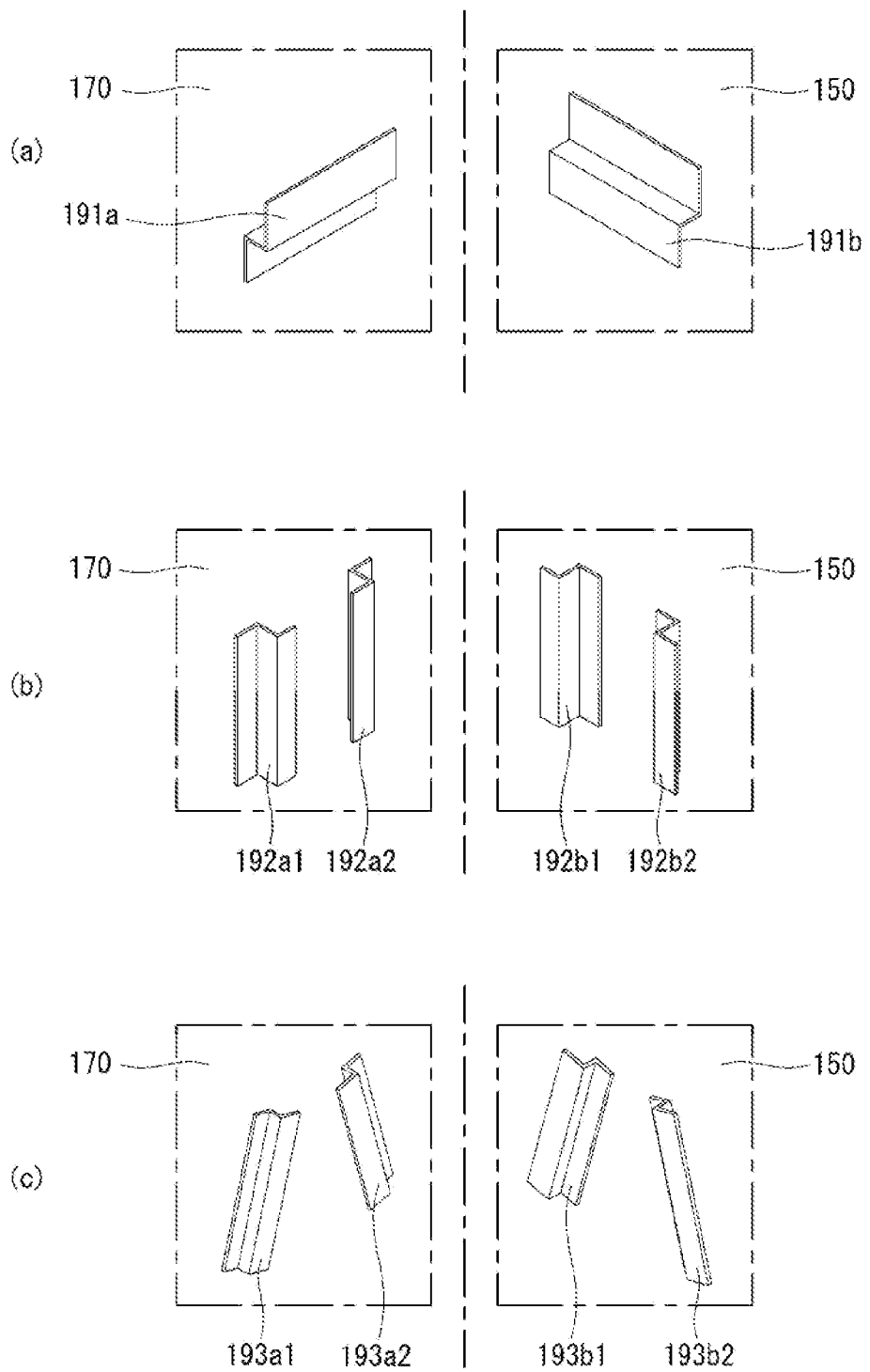

[FIG. 12]
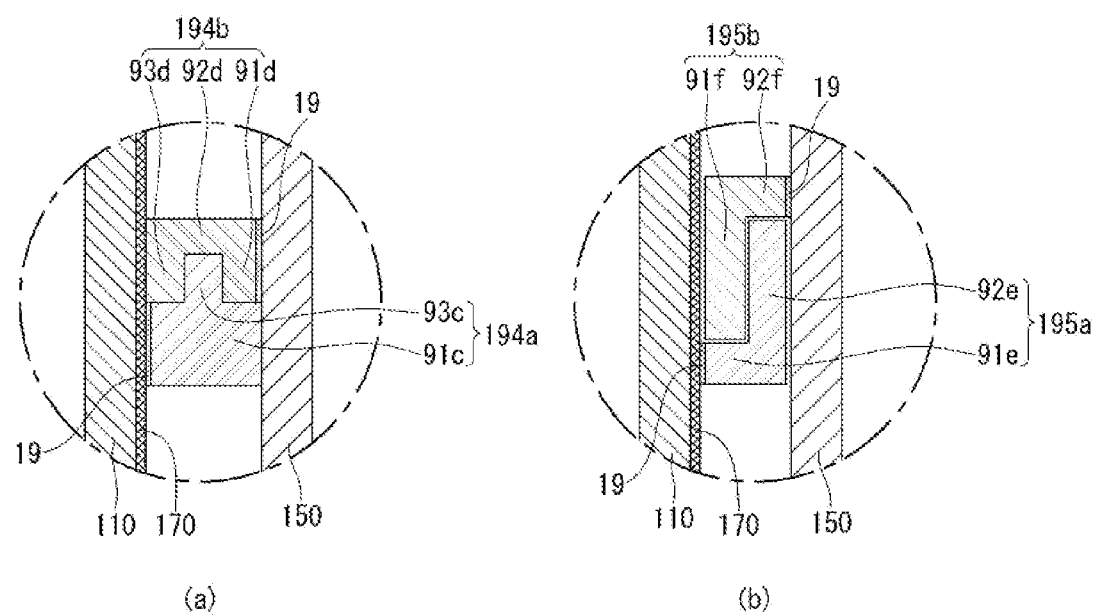
(a)　　　　　　　　　(b)

[FIG. 13]
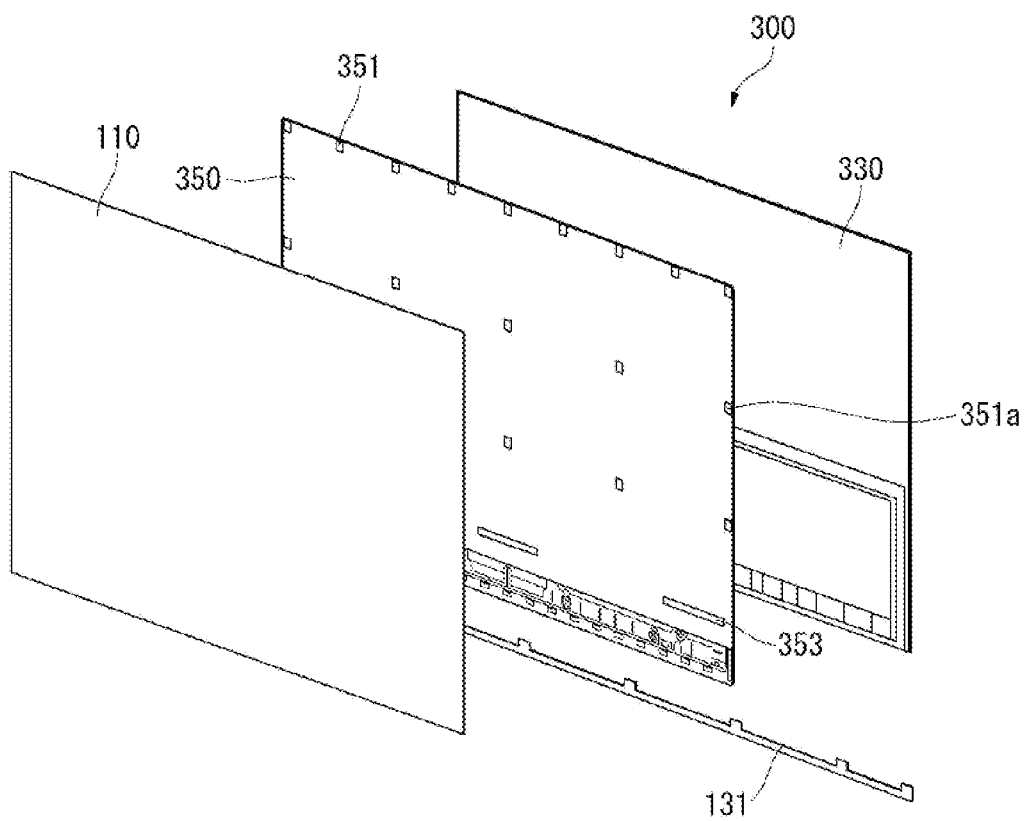

[FIG. 14]
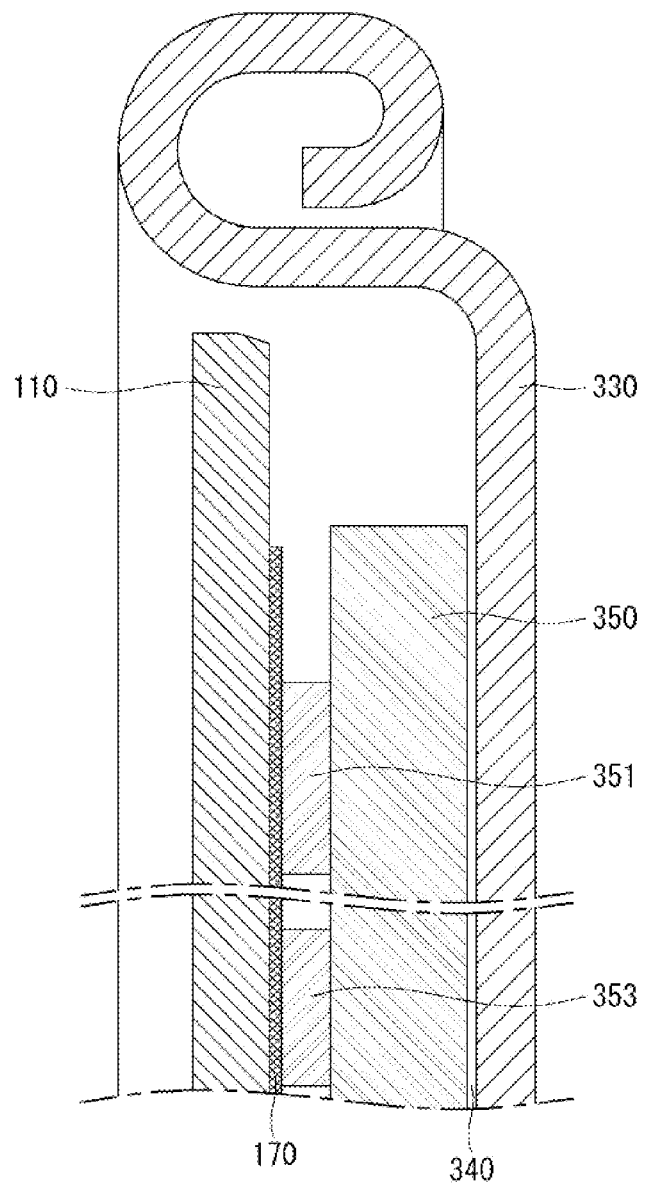

[FIG. 15]
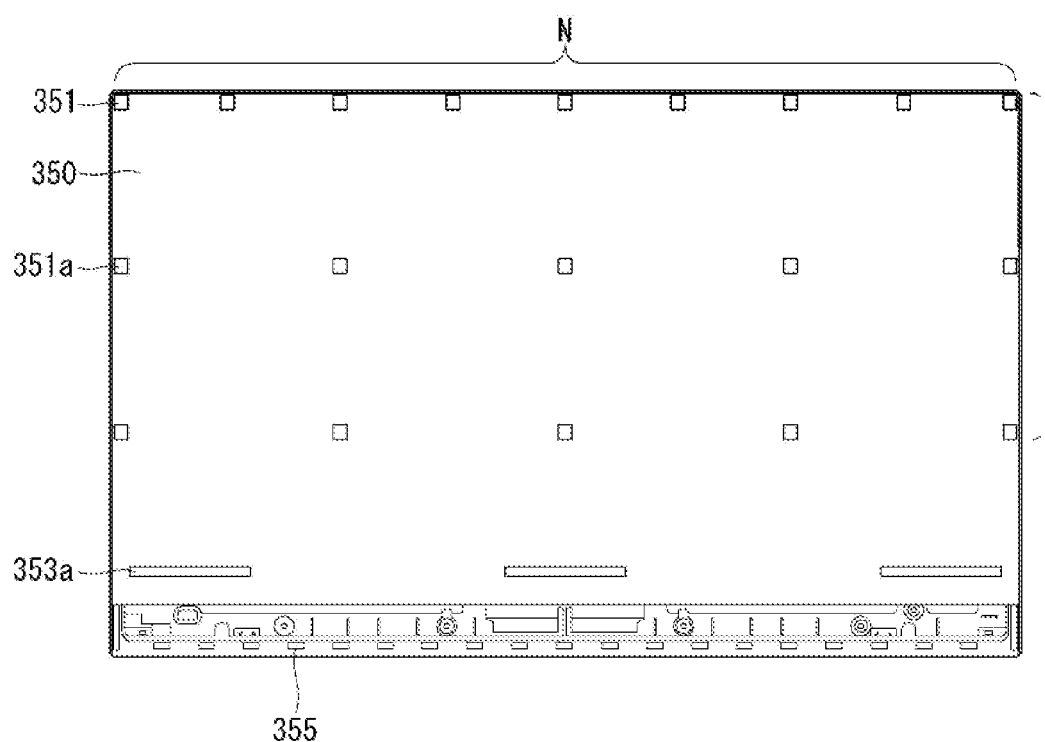

[FIG. 16]
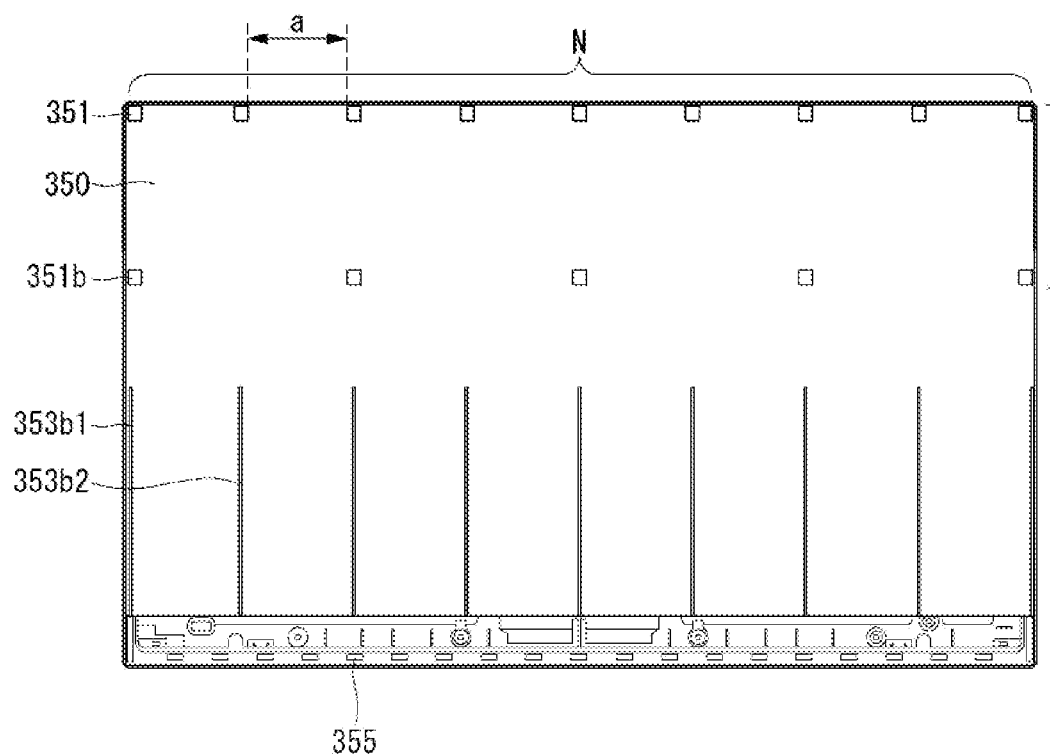
[FIG. 17]
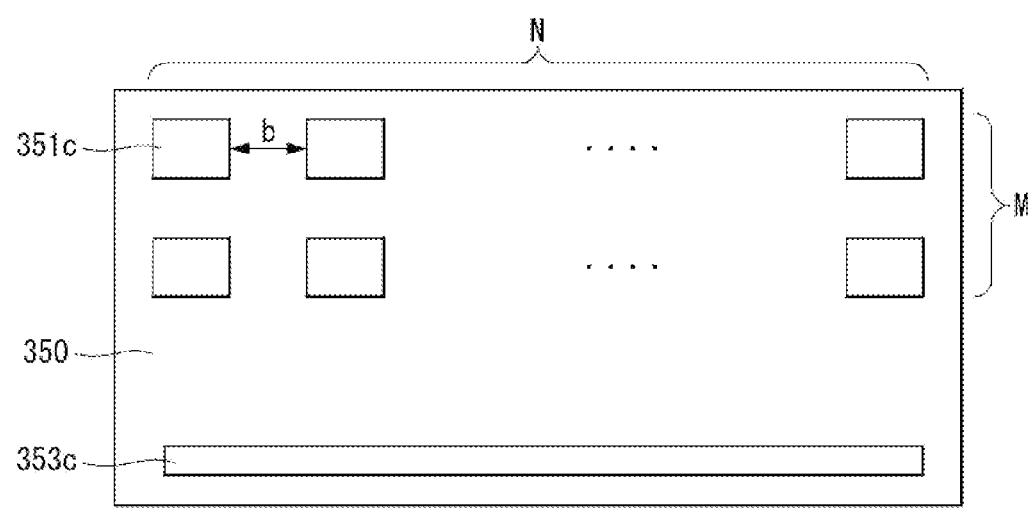

[FIG. 18]
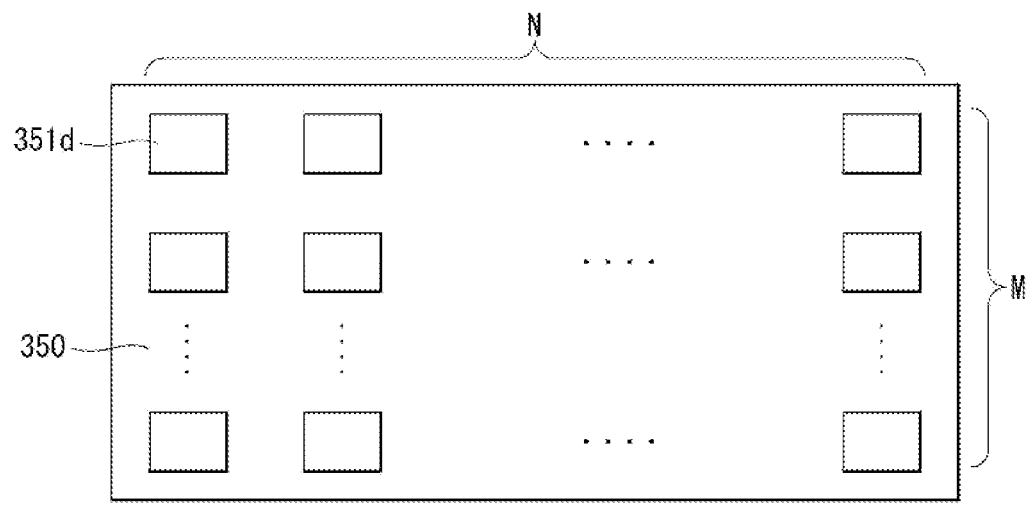
[FIG. 19]
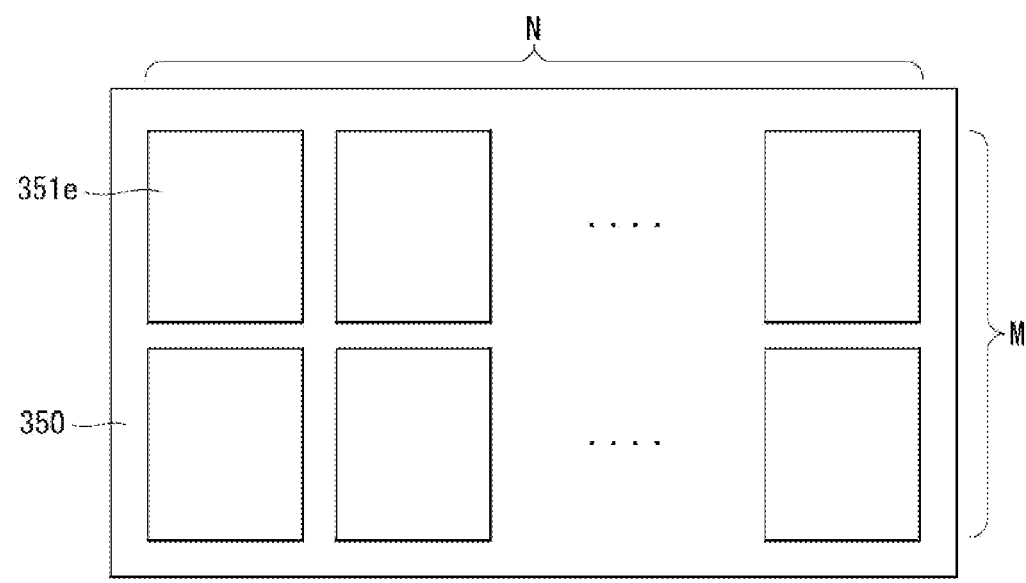

[FIG. 20]
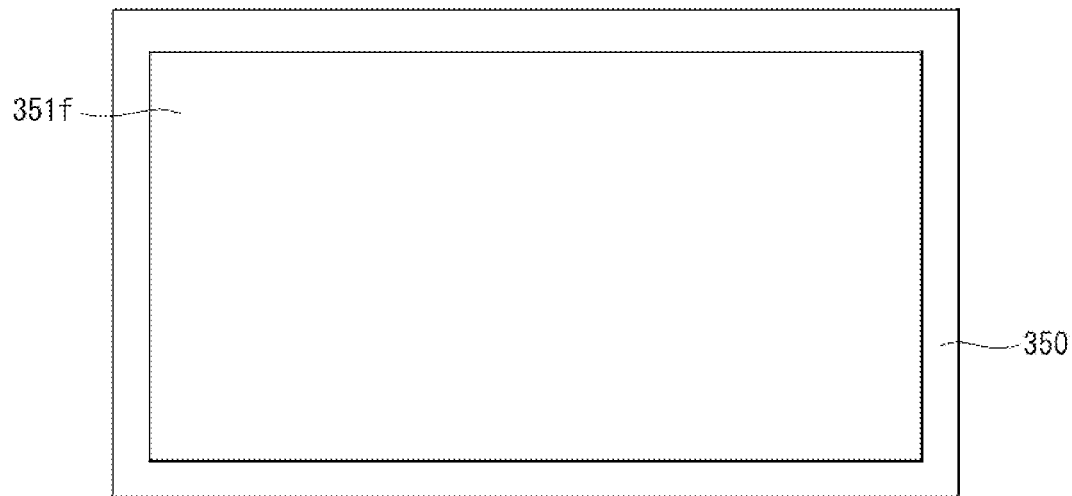
[FIG. 21]
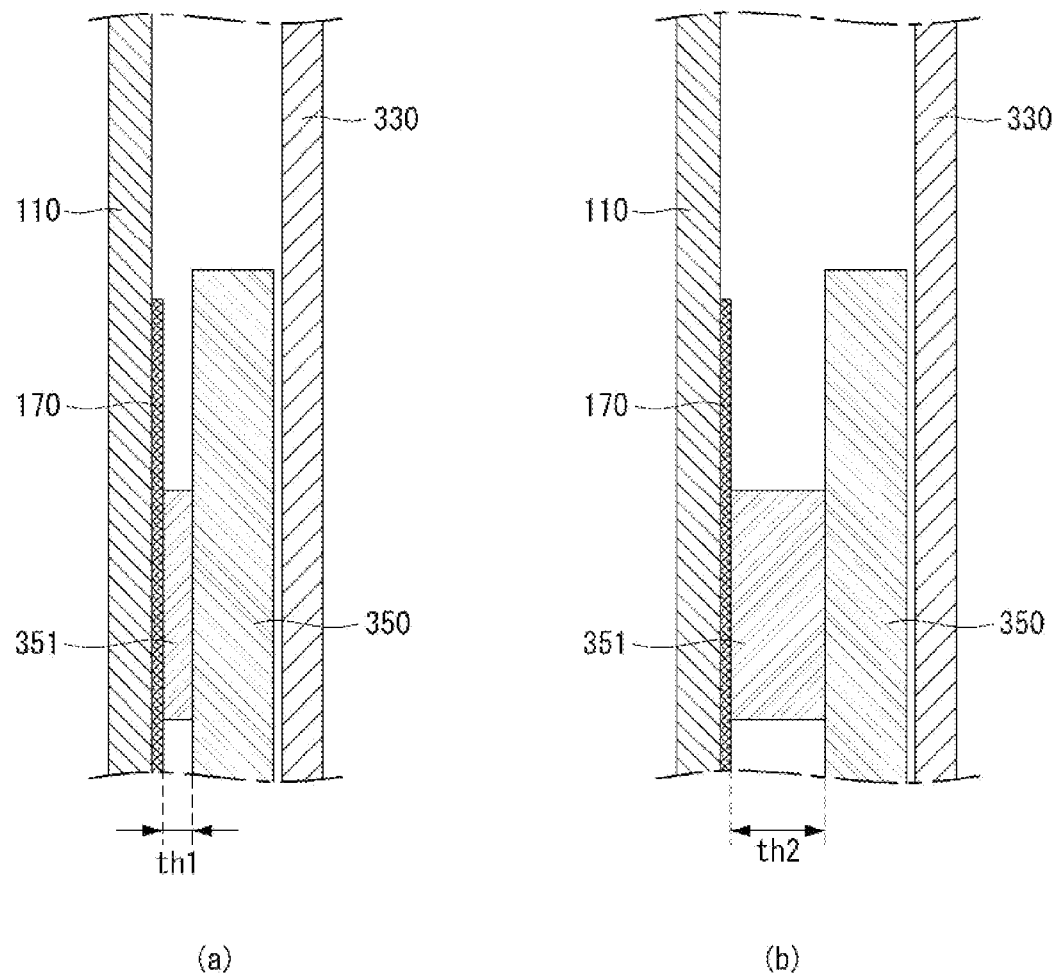
(a)　　　　　　　　　　　(b)

[FIG. 22]
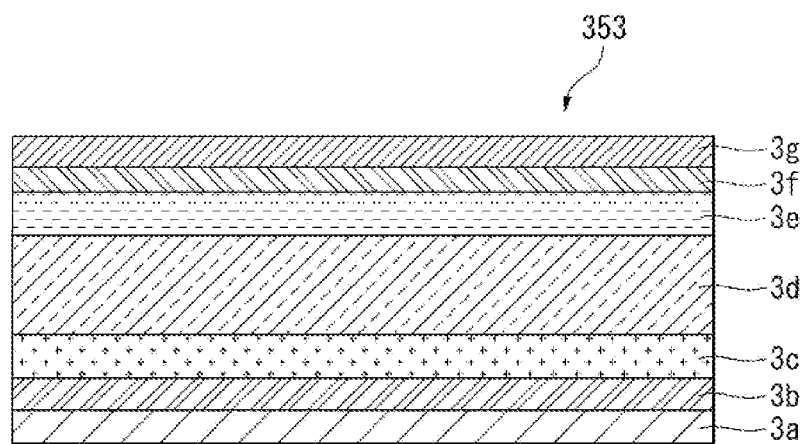
[FIG. 23]
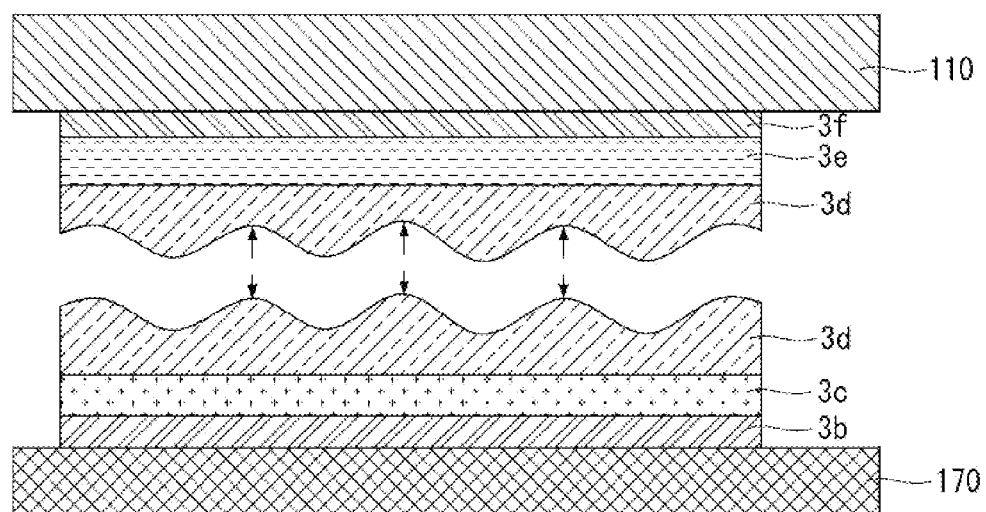

DISPLAY DEVICE

CROSS-REFERENCE TO RELATED APPLICATIONS

This application is a continuation of U.S. patent application Ser. No. 16/768,250, filed on May 29, 2020, which is the National Stage filing under 35 U.S.C. 371 of International Application No. PCT/KR2018/006101, filed on May 29, 2018, which claims the benefit of earlier filing date and right of priority to Korean Application No. 10-2017-0163422, filed on Nov. 30, 2017, the contents of which are all hereby incorporated by reference herein in their entirety.

TECHNICAL FIELD

The present disclosure relates to a display device.

BACKGROUND ART

With the development of the information society, the demand for display devices is also increasing in various forms, and in response to this, various display devices such as a liquid crystal display device (LCD), a plasma display panel (PDP), an electroluminescent display (ELD), and a vacuum fluorescent display (VFD) have been researched and used.

Among them, a display device using an organic light emitting diode (OLED) has an advantage in that it has excellent luminance characteristics and viewing angle characteristics compared to a liquid crystal display device, and can be implemented in an ultra-thin form without requiring a backlight unit.

Recently, many studies have been conducted on the assembly structure of such display devices.

DETAILED DESCRIPTION OF INVENTION

Technical Problem

The present disclosure aims to solve the above-mentioned problems and other problems. In addition, the present disclosure aims to provide a display device that can be easily disassembled so that it can be replaced by individual parts by improving the batch disposal since the display panel or module cover cannot be replaced for each part.

Technical Solution

According to an aspect of the present disclosure, the present disclosure provides a display device including a display panel; a main frame positioned behind the display panel; an inner plate positioned between the display panel and the main frame; a support plate mounted on a back surface of the display panel and facing the inner plate; and a coupling member for coupling the inner plate and the support plate, wherein the coupling member includes a first coupling member mounted on the support plate; and a second coupling member mounted on the inner plate and coupled to the first coupling member.

According to another aspect of the present disclosure, the first coupling member may include a fastening area fastened to the support plate, a protruding area that is bent and protrudes from one side of the fastening area, and an extending area that is bent and extended from the protruding area, and the second coupling member may include a fastening area fastened to the inner plate, a protruding area that is bent and protrudes from one side of the fastening area, and an extending area that is bent and extended from the protruding area.

According to another aspect of the present disclosure, the extending area of the first coupling member may be disposed between the inner plate and the extending area of the second coupling member, and the extending area of the second coupling member may be disposed between the support plate and the extending area of the first coupling member.

According to another aspect of the present disclosure, a bonding member may be disposed between the first coupling member and the support plate, and between the second coupling member and the inner plate.

According to another aspect of the present disclosure, a plurality of the first and second coupling members may be disposed in a vertical direction, a horizontal direction, or a diagonal direction.

According to another aspect of the present disclosure, the main frame may be opened at a lower part, and may be bent at an edge except for the opened lower part, and may include a bottom frame coupled to the opened lower part.

According to another aspect of the present disclosure, the display panel may be inserted and disposed in the main frame through the opened lower part of the main frame.

According to another aspect of the present disclosure, the edge of the bent main frame and the bottom frame may be formed to wrap an outer surface of the display panel.

According to another aspect of the present disclosure, the main frame may include a body; a first long side disposed by being extended from an upper side of the body; a first short side disposed by being extended from a right side of the body; a second short side disposed by being extended from a left side of the body; and a second long side cut-out to an inside of the body, wherein the first long side may include an 11th wall being extended from the upper side of the body and a 12th wall being extended from an upper side of the 11th wall, the first short side may include a 31st wall being extended from the right side of the body and a 32nd wall being extended from a right side of the 31st wall, and the second short side may include a 41st wall being extended from the left side of the body and a 42nd wall being extended from a right side of the 41st wall.

According to another aspect of the present disclosure, the 11th wall, the 31st wall, and the 41st wall may be bent at the body, and the 12th wall, the 32nd wall, and the 42nd wall may be bent at the 11th wall, the 31st wall, and the 41st wall to face the body, respectively.

According to another aspect of the present disclosure, a right side of the 11th wall may be in contact with an upper side of the 31st wall, a right side of the 12th wall may be in contact with an upper side of the 32nd wall, a left side of the 11th wall may be in contact with an upper side of the 41st wall, and a left side of the 12th wall may be in contact with an upper side of the 42nd wall.

According to another aspect of the present disclosure, the main frame may include a guide member which is disposed in an outermost area of the lower part of the main frame and the bottom frame may include a guide bar which is disposed in an outermost area of an upper part of the bottom frame.

According to another aspect of the present disclosure, a protrusion of the guide bar may be inserted into and fastened to a groove of the guide member.

According to another aspect of the present disclosure, the main frame may include a first fastening member disposed on a lower part of a back surface or a rear surface of the main frame, the bottom frame may include a second fastening member disposed on an upper part of a back surface or a rear surface of the bottom frame, the first fastening member may include an 11th fastening member disposed on both sides of the lower part of the main frame and protruding from the rear surface of the main frame, and a 12th fastening member disposed between the 11th fastening members, protruding to a predetermined height from the lower part of the main frame, and forming a predetermined inner space in the protruding lower part.

According to another aspect of the present disclosure, the second fastening member may include a 21st fastening member disposed on both sides of the upper part of the bottom frame and formed at a position corresponding to the 11th fastening member, and a 22nd fastening member disposed between the 21st fastening members and formed at a position corresponding to the 12th fastening member, wherein the 22nd fastening member may be extended from the rear surface of the bottom frame and may be inserted into the inner space of the 12th fastening member.

Advantageous Effects

According to an embodiment of the present disclosure, there is an effect capable of firmly fixing the main frame and the display panel regardless of environmental conditions such as time and temperature/humidity.

According to an embodiment of the present disclosure, there is an effect capable of improving a warranty by easily separating the inner plate and the display panel and easily replacing them for individual parts.

Additional scope of applicability of the present disclosure will become apparent from the following detailed description. However, various changes and modifications within the spirit and scope of the present disclosure may be clearly understood by those skilled in the art, and thus, it should be understood that specific embodiments, such as the detailed description and preferred embodiments of the present disclosure, are given only by way of illustration.

DESCRIPTION OF DRAWINGS

FIGS. 1 to 10 are diagrams illustrating examples of a display device according to an embodiment of the present disclosure.

FIGS. 11 to 12 are diagrams illustrating other examples of a display device according to an embodiment of the present disclosure.

FIGS. 13 to 15 are diagrams illustrating examples of a display device according to another embodiment of the present disclosure.

FIGS. 16 to 23 are diagrams illustrating other examples of a display device according to another embodiment of the present disclosure.

MODE FOR INVENTION

Hereinafter, embodiments of the present disclosure will be described in detail with reference to the accompanying drawings, however, the same or similar elements are denoted by the same reference numerals regardless of the reference numerals, and redundant description thereof will be omitted.

The suffixes "module" and "part" for components used in the following description are given or mixed in consideration of ease of specification, and do not have their own meaning or role. Further, in describing the embodiments disclosed in this specification, when it is determined that the detailed description of the related art is likely to blur the gist of the embodiment disclosed in this specification, a detailed description thereof will be omitted. Also, the accompanying drawings are only for the purpose of easily understanding the embodiments disclosed in the present disclosure, and the technical idea disclosed in the present disclosure is not limited by the accompanying drawings, it should be understood that the present disclosure include all modifications, equivalents and substitutes included within the spirit and technical scope of the present disclosure.

The terms first, second, etc. may be used to describe various components, but the components are not limited by such terms. The terms are used only for the purpose of distinguishing one component from other components.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

A singular expression can include a plural expression as long as it does not have an apparently different meaning in context.

In the present disclosure, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Hereinafter, an organic light emitting diode display panel (OLED) will be described as an example of a display panel, but the display panel applicable to the present disclosure is not limited to the OLED panel, and it may also be a plasma display panel (PDP), a field emission display (FED), or a liquid crystal panel (LCD).

Referring to FIG. 1, a display device 100 may include a first long side LS1, a second long side LS2 opposite the first long side LS1, a first short side SS1 adjacent to the first long side LS1 and the second long side LS2, and a second short side SS2 opposite the first short side SS1.

The display device 100 may refer to the first short side area SS1 as a first side area, and the second short side area SS2 as a second side area opposite the first side area. The display device 100 may refer to the first long side area LS1 as a third side area adjacent to the first side area and the second side area and positioned between the first side area and the second side area, and may refer to the second long side area LS2 as a fourth side area adjacent to the first side area and the second side area and positioned between the first side area and the second side area and opposite the third side area.

In addition, for convenience of description, although the lengths of the first and second long sides LS1 and LS2 are longer than the lengths of the first and second short sides SS1 and SS2, the lengths of the first and second long sides LS1 and LS2 may be approximately the same as the lengths of the first and second short sides SS1 and SS2.

Hereinafter, a first direction DR1 may be a direction parallel to the long sides LS1 and LS2 of a display panel 110, and a second direction DR2 may be a direction parallel to the short sides SS1 and SS2 of the display panel 110. A third direction DR3 may be a direction perpendicular to the first direction DR1 and/or the second direction DR2.

In another aspect, a side where the display device 100 displays images may be referred to as a front side or a front surface. When the display device 100 displays images, a side where the images cannot be observed may be referred to as a back side or a back surface. When looking at the display device 100 from the front side or the front surface, the first long side LS1 may be referred to as an upper side or an upper surface, and the second long side LS2 may be referred to as a lower side or a lower surface. When looking at the display device 100 from the front side or the front surface, the first short side SS1 may be referred to as a right side or a right surface, and the second short side SS2 may be referred to as a left side or a left surface.

In addition, the first long side LS1, the second long side LS2, the first short side SS1, and the second short side SS2 may be referred to as an edge of the display device 100. Also, a point at which the first long side LS1, the second long side LS2, the first short side SS1, and the second short side SS2 meet each other may be referred to as a corner. For example, a point where the first long side LS1 meets the first short side SS1 may be a first corner C1, a point where the first long side LS1 meets the second short side SS2 may be a second corner C2, a point where the second short side SS2 meets the second long side LS2 may be a third corner C3, and a point where the second long side LS2 meets the first short side SS1 may be a fourth corner C4.

Here, a direction from the first short side SS1 to the second short side SS2 or a direction from the second short side SS2 to the first short side SS1 may be referred to as a left-right direction LR or a horizontal direction DR1. A direction from the first long side LS1 to the second long side LS2 or a direction from the second long side LS2 to the first long side LS1 may be referred to as an up-down direction UD or a vertical direction DR2.

In addition, a direction from the front surface to the back surface or a direction from the back surface to the front surface may be referred to as a front-back direction DR3 or a thickness direction FB. The front-back direction DR3 may be a direction perpendicular to the left-right direction DR1 and/or the up-down direction DR2.

Referring to FIG. 2, the display device 100 may include a display panel 110, a main frame 130, and an inner plate 150.

The display panel 110 is provided on the front surface of the display device 100 and may display images. The display panel 110 may display the images by outputting RGB (red, green or blue) for each pixel depending on timing. The display panel 110 may be divided into an active area in which the images are displayed and a de-active area in which the images are not displayed.

The display panel 110 may be a thin flat panel. For example, the display panel 110 may be an organic light emitting diode (OLED) panel. An active matrix type organic light emitting display panel includes an organic light emitting diode (hereinafter referred to as "OLED") that emits light by itself, and has advantages such as a fast response speed, high light emission efficiency, high brightness, and a wide viewing angle.

The OLED, which is a self-emission device, may include an anode electrode, a cathode electrode, and organic compound layers (HIL, HTL, EML, ETL, EIL) formed therebetween. The organic compound layer may be formed of a hole injection layer (HIL), a hole transport layer (HTL), an emission layer (EML), an electron transport layer (ETL), and an electron injection layer (EIL). When a driving voltage is applied to the anode electrode and the cathode electrode, holes passing through the hole transport layer HTL and electrons passing through the electron transport layer ETL are moved to the emission layer EML to form excitons, and as a result, the emission layer EML may generate visible light.

Accordingly, the OLED does not require a separate light source, and the volume and weight of the display device 100 can be reduced. In addition, the OLED may have a response speed more than 1000 times faster than a conventional liquid crystal display device.

The main frame 130 may be disposed behind the display panel 110. The main frame 130 may be coupled to the display panel 110. In order for the main frame 130 to be coupled to the display panel 110, the main frame 130 and/or other structures adjacent thereto may include a protruding part, a sliding part, a coupling part, and the like.

The main frame 130 may include a bottom frame 131. The bottom frame 131 may be disposed under the main frame 130. The bottom frame 131 may be separated from or coupled to the main frame 130. The main frame 130 and the bottom frame 131 may cover a part of a front surface and a side surface of the display panel 110.

The inner plate 150 may be disposed behind the display panel 110. The inner plate 150 may be disposed between the display panel 110 and the main frame 130. A front surface of the inner plate 150 may face the display panel 110. The other surface of the inner plate 150 may be fastened to the main frame 130.

The inner plate 150 may face a support plate 170 mounted on a back surface of the display panel 110. The inner plate 150 may be connected to or coupled to the support plate 170 through a coupling member 190.

The coupling member 190 may couple the inner plate 150 to the support plate 170. The coupling member 190 may be formed or fixed to a back surface of the support plate 170 and the front surface of the inner plate 150.

Referring to FIG. 3, the main frame 130 may be formed of a flat plate having a predetermined thickness. The main frame 130 may include a body 130$b$, a first long side LS1, a second long side LS2, a first short side SS1, and a second short side SS2.

The body 130$b$ may be formed as a flat plate. The body 130$b$ may form at least one frame groove H between a lower area and a central area. A panel driver (not shown) for driving the display panel 110 may be disposed corresponding to the frame groove H.

The first long side LS1 may be disposed on an upper side or an upper surface of the body 130$b$. The first long side LS1 may include an 11th wall LSB1 being extended from the upper side of the body 130$b$ and a 12th wall LSE1 being extended from an upper side of the 11th wall LSB1.

The second long side LS2 may be cut-out to an inside of the body 130$b$.

The first short side SS1 may include a 31st wall SSB1 being extended from the right side of the body 130$b$ and a 32nd wall SSE1 being extended from a right side of the 31st wall SSB1.

The second short side SS2 may include a 41st wall SSB2 being extended from the left side of the body 130$b$ and a 42nd wall SSE2 being extended from a left side of the 41st wall SSB2.

The main frame 130 may be molded using a shearing machine or a die. For example, the main frame 130 may be molded from a cut-off operation, a shearing operation, or a pressing operation of four edges or four corners.

For example, the four corners formed in the main frame 130 may be cut in a diagonal direction. A right side RB1 of the 11th wall LSB1 may be cut in the vertical direction DR2, and a right side RE1 of the 12th wall LSE1 may be cut in a first diagonal direction DR4. An upper side UB1 of the 31st wall SSB1 may be cut in the horizontal direction DR1, and an upper side UE1 of the 32nd wall SSE1 may be cut in the first diagonal direction DR4.

A lower side DB1 of the 31st wall SSB1 may be cut in the horizontal direction DR1, and a lower side DE1 of the 32nd wall SSE1 may be cut in a second diagonal direction DR5.

A left side LB1 of the 11th wall LSB1 may be cut in the vertical direction DR2, and a left side LE1 of the 12th wall LSE1 may be cut in the second diagonal direction DR5. An upper side UB2 of the 41st wall SSB2 may be cut in the horizontal direction DR1, and an upper side UE2 of the 42nd wall SSE2 may be cut in the second diagonal direction DR5.

A lower side DB2 of the 41st wall SSB2 may be cut in the horizontal direction DR1, and a lower side DE2 of the 42nd wall SSE2 may be cut in the first diagonal direction DR4.

Referring to FIG. 4, the main frame 130 may include an bended edge or a bended border.

The edges (SSB1, SSE1, SSB2, SSE2, LSB1, LSE1) or the borders formed on the first short side SS1, the second short side SS2, and the first long side LS1 of the main frame 130 may be bent at least once. For example, the edges (SSB1, SSE1, SSB2, SSE2, LSB1, LSE1) of the main frame 130 may be bent toward the front F of the main frame 130, and then bent at 90° (degrees) toward the inside of the main frame 130.

The 11th wall LSB1 of the first long side LS1 may be bent at 90° (degrees) toward the front F of the main frame 130. The 12th wall LSE1 of the first long side LS1 may be bent at 90° (degrees) toward the inside of the main frame 130 from the 11th wall LSB1 of the first long side LS1 to face the body 130b of the main frame 130.

The 31st wall SSB1 of the first short side SS1 may be bent at 90° (degrees) toward the front F of the main frame 130. The 32nd wall SSE1 of the first short side SS1 may be bent at 90° (degrees) toward the inside of the main frame 130 from the 31st wall SSB1 of the first short side SS1 to face the body 130b of the main frame 130.

The 41th wall SSB2 of the second short side SS2 may be bent at 90° (degrees) toward the front F of the main frame 130. The 42nd wall SSE2 of the second short side SS2 may be bent at 90° (degrees) toward the inside of the main frame 130 from the 41st wall SSB2 of the second short side SS2 to face the body 130b of the main frame 130. The edges LSB1 and LSE1 of the bent first long side LS1 may be in contact with the upper sides UB1 and UE1 of the edge SSB1 and SSE1 of the bent first short side SS1 and the upper sides UB2 and UE2 of the edge SSB2 and SSE2 of the bent second short side SS2. For example, the cut right sides RB1 and RE1 of the edges LSB1 and LSE1 of the first long side LS1 may be fixed in contact with the cut upper sides UB1 and UE1 of the edges SSB1 and SSE1 of the first short side SS1. The cut left sides LB1 and LE1 of the edges LBS1 and LSE1 of the first long side LS1 may be fixed in contact with the cut upper side UB2 and UE2 of the edges SSB2 and SSE2 of the second short side SS2.

Referring to FIGS. 3 and 4, the right side RB1 cut in the vertical direction DR2 of the 11th wall LSB1 of the first long side LS1 may be fixed in contact with the upper side UB1 cut in the horizontal direction DR1 of the 31st wall SSB1 of the first short side SS1. In addition, the right side RE1 cut in the first diagonal direction DR4 of the 12th wall LSE1 of the first long side LS1 may be fixed in contact with the upper side UE1 cut in the first diagonal direction DR4 of the 32nd wall SSE1 of the first short side SS1.

The left side LB1 cut in the vertical direction DR2 of the 11th wall LSB1 of the first long side LS1 may be fixed in contact with the upper side UB2 cut in the horizontal direction DR1 of the 41st wall SSB2 of the second short side SS2. In addition, the left side LE1 cut in the second diagonal direction DR5 of the 12th wall LSE1 of the first long side LS1 may be fixed in contact with the upper side UE2 cut in the second diagonal direction DR5 of the 42nd wall SSE2 of the second short side SS2.

The cut both edges RB1, RE1, LB1, LE1 of the edge of the first long side LS1 may be coupled to the cut upper edges UB1 and UE1 of first short side SS1 and the cut upper edges UB2 and UE2 of second short side SS2 by using an adhesive, a double-sided tape, an internal welding or a guarantee material.

Accordingly, the cut both edges RB1, RE1, LB1, LE1 of the edge of the first long side LS1 may minimize a gap between the cut upper edges UB1 and UE1 of first short side SS1 and the cut upper edges UB2 and UE2 of second short side SS2.

A lower part of the main frame 130 may be opened.

Referring to FIG. 5, the inner plate 150 may be mounted on a front surface of the main frame 130. The inner plate 150 may have a smaller size than the main frame 130. The inner plate 150 may be embedded in the main frame 130 whose edges are bent. The main frame 130 whose edges are bent may surrounds a back surface of the inner plate 150 and a side surface of the inner plate 150.

The inner plate 150 may include at least one plate groove PH. A plurality of plate grooves PH may be spaced apart at predetermined intervals in the inner plate 150. The plate groove PH may be formed at different heights.

The inner plate 150 may be fixed to the main frame 130 through a fixing member (not shown). For example, the fixing member may be an adhesive, a double-sided tape, a bolt, a screw, or the like.

The coupling member 190 may be mounted on the front surface of the inner plate 150. The coupling member 190 may protrude from the inner plate 150 toward the front. A plurality of coupling members 190 may be provided. The plurality of coupling members 190 may be spaced apart at regular intervals. The coupling member 190 may be disposed in the central area of the inner plate 150.

The coupling member 190 may be fixed to the inner plate 150 using the fixing member.

The bottom frame 131 may be separated from the lower part of the main frame 130.

Referring to FIGS. 6a and 6b, the support plate 170 may be mounted on a back surface or a rear surface of the display panel 110.

The display panel 110 may be inserted in a sliding manner through the lower part of the main frame 130. The display panel 110 may be inserted into and embedded in the main frame 130 whose edges are bent. The display panel 110 may be inserted through the opened lower part of the main frame 130, and then mounted on the main frame 130 along the bent first short side SS1 and second short side SS2.

The main frame 130 whose edges are bent may surrounds an edge of a front surface of the display panel 110 and a side surface or the like of the display panel 110.

The main frame 130 may be disposed behind the display panel 110. The main frame 130 may face the support plate 170.

The bottom frame 131 may be fastened to the main frame 130 using fastening members 13a, 13b, 14a, and 14b. The fastening members 13a, 13b, 14a, and 14b may include first fastening members 13a, 14a and second fastening members 13b, 14b. The first fastening members 13a and 14a may be fastened to the second fastening members 13b and 14b.

The first fastening members 13a and 14a may be disposed on a lower part of a back surface (or a rear surface) of the main frame 130. The first fastening members 13a and 14a may include an 11th fastening member 13a and a 12th fastening member 14a.

The 11th fastening members 13a may be disposed on both sides of the lower part of the main frame 130, respectively. The 11th fastening member 13a may protrude from the rear surface of the main frame 130.

The 12th fastening member 14a may be spaced apart from the 11th fastening member 13a in the horizontal direction. The 12th fastening member 14a may be disposed between the 11th fastening members 13a. The 12th fastening member 14a may be disposed on the lower part of the main frame 130 and may be formed to be long along the lower part.

The 12th fastening member 14a may protrude to a predetermined height from the lower part of the main frame 130. In addition, the 12th fastening member 14a may form a predetermined inner space in the protruding lower part. The inner space may be a space into which a 22nd fastening member 14b may be inserted. The second fastening members 13b and 14b may be disposed on an upper part of a back surface or a rear surface of the bottom frame 131. The second fastening members 13b and 14b may include a 21st fastening member 13b and the 22nd fastening member 14b.

The 21st fastening member 13b may be disposed on both sides of the upper part of the bottom frame 131, respectively. The 21st fastening member 13b may be formed at a position corresponding to the 11th fastening member 13a. The 21st fastening member 13b may protrude from the rear surface of the bottom frame 131 and then may be bent toward the main frame 130. For example, the 21st fastening member 13b may have a "¬" shape. In addition, the 21st fastening member 13b may include a fastening hole h2. The fastening hole h2 may be formed in the bent 21st fastening member 13b.

The 22nd fastening member 14b may be disposed between the 21st fastening members 13b. The 22nd fastening member 14b may be formed at a position corresponding to the 12th fastening member 14a. The 22nd fastening member 14b may be extended from the rear surface of the bottom frame 131.

The 22nd fastening member 14b may include auxiliary fastening members 14b1 and 14b2. The auxiliary fastening members 14b1 and 14b2 may be spaced apart from both sides of the 22nd fastening member 14b. The auxiliary fastening members 14b1 and 14b2 may protrude from the rear surface of the bottom frame 131 and then may be bent toward the main frame 130. The auxiliary fastening members 14b1 and 14b2 may have a "Z" shape.

In addition, a guide member 130a may be formed on a lower part of the first short side SS1, which is the edge of the main frame 130. The guide member 130a may be formed to be concave along the first short side SS1. In addition, the guide member 130a may include a guide groove h1. The guide groove h1 may be formed at an end of the guide member 130a.

A guide bar 131a may be formed at each of an outermost area of side of the upper part of the bottom frame 131. The guide bar 131a may be spaced apart from the 21st fastening member 13b. The guide bar 131a may be formed at a position corresponding to the guide member 130a. The guide bar 131a may be extended and protrude from an upper side of the outermost area of the bottom frame 131.

Referring to FIG. 7, the bottom frame 131 may be fastened to the lower part of the main frame 130. The bottom frame 131 may be mounted on the main frame 130 after the display panel 110 is mounted on the main frame 130.

The 21st fastening member 13b may be fastened to the 11th fastening member 13a (see FIG. 6b). The 22nd fastening member 14b may be inserted into and fastened to the inner space of the 12th fastening member 14a. The auxiliary fastening members 14b1 and 14b2 may be in contact with the rear surface of the main frame 130.

The 21st fastening member 13b may be fixed through a screw S after being fastened to the 11th fastening member 13a (see FIG. 6b). However, the present disclosure is not limited thereto, and the 11th fastening member 13a and the 12th fastening member 14a may be fixed through various fastening members.

The main frame 130 and the bottom frame 131 may be fixed through the 11th fastening member (13a, see FIG. 6b) and the 21st fastening member 13b, and through the 12th fastening member 14a and the 22nd fastening member 14b.

As the 21st fastening member 13b and the 11th fastening member (13a, see FIG. 6b) are fastened through the screw, the bottom frame 131 may be securely fixed to the main frame 130 without shaking or moving in the vertical direction, the horizontal direction or the front-back direction in the main frame 130.

In addition, the 22nd fastening member 14b may be inserted into and fastened to the inner space of the 12th fastening member 14a. Further, the auxiliary fastening members 14b1 and 14b2 may be in contact with the rear surface of the bottom frame 131.

Accordingly, the bottom frame 131 is securely fixed to the lower part of the main frame 130 through the 12th fastening member 14a, the 22nd fastening member 14b, and the auxiliary fastening members 14b1, 14b2, so that detachment of the display panel 110 inserted into the inner space of the main frame 130 can be prevented.

The guide member 130a and the guide bar 131a may be disposed at a frame corner FC that is an outermost area where the main frame 130 and the bottom frame 131 are in contact with each other.

Referring to an FIG. 7 showing a cross section of B-B', the guide bar 131a may include a protrusion 31a. The protrusion 31a is disposed near the end of the guide bar 131a and may protrude toward the guide member 130a.

When the bottom frame 131 is fastened to the main frame 130, the guide bar 131a may be coupled along the guide member 130a. When the bottom frame 131 is fastened to the main frame 130, the protrusion 31a of the guide bar 131a may be inserted into the groove h1 of the guide member 131a.

As described above, as the protrusion 31a of the guide bar 131a is inserted into and fixed to the groove h1 of the guide member 130a, the display device 100 can minimize a gap of the frame corner FC that is the outermost area where the main frame 130 and the bottom frame 131 are in contact with each other.

Referring to FIG. 8, the coupling member 190 may include a first coupling member 190a and a second coupling member 190b.

The first coupling member 190a may be mounted on a rear surface of the support plate 170. A plurality of first coupling members 190a may be provided. The first coupling member 190a may be disposed spaced apart from each other in the horizontal direction.

The first coupling member 190a may be fastened or coupled to the support plate 170 through a bonding member 19. For example, the bonding member 19 may be a double-sided tape or an adhesive.

The first coupling member 190a may be bent at least once. The first coupling member 190a may include a fastening area 91*a* fastened to the support plate 170, a protruding area 92*a* that is bent and protrudes from one side of the fastening area 91*a*, and an extending area 93*a* that is bent and extended from the protruding area 92*b*.

The second coupling member 190*b* may be mounted on the front surface of the inner plate 150. The second coupling member 190*b* may be disposed to correspond to the first coupling member 190*a*. A plurality of second coupling members 190*b* may be provided. The second coupling members 190*b* may be disposed spaced apart from each other in the horizontal direction.

The second coupling member 190*b* may be fastened or coupled to the inner plate 150 through the bonding member 19. For example, the bonding member 19 may be a double-sided tape, an adhesive or a screw.

The second coupling member 190*b* may be bent at least once. The second coupling member 190*b* may include a fastening area 91*b* fastened to the inner plate 150, a protruding area 92*b* that is bent and protrudes from one side of the fastening area 91*b*, and an extending area 93*b* that is bent and extended from the protruding area 92*b*.

Referring to FIGS. 9 and 10, the cut part of A-A' in FIG. 1 is briefly shown.

The edges LSB1 and LSE1 or the borders formed on the first long side LS1 of the main frame 130 may be bent at least once. For example, the edges LSB1 and LSE1 of the main frame 130 are bent toward the front F of the main frame 130 and then bent at 90° (degrees) toward the inside of the main frame 130.

The 11th wall LSB1 of the first long side LS1 may be bent at 90° (degrees) from the body 130*a* of the main frame 130. The 12th wall LSE1 of the first long side LS1 may be bent at 90° (degrees) toward the inside of the main frame 130 from the 11th wall LSB1 of the first long side LS1 so as to face the body 130*b* of the main frame 130. The first coupling member 190*a* may be coupled to the second coupling member 190*b*. The first coupling member 190*a* may face or be in contact with the inner plate 150. The second coupling member 190*b* may face or be in contact with the support plate 170.

While the display panel 110 is inserted into the main frame 130, the extending area 93*a* of the first coupling member 190*a* may be disposed between the extending area 93*b* of the second coupling member 190*b* and the inner plate 150.

One surface of the extending area 93*a* of the first coupling member 190*a* may face or be in contact with the inner plate 150. The other surface of the extending area 93*a* of the first coupling member 190*a* may be spaced apart from the support plate 170. The other surface of the extending area 93*a* of the first coupling member 190*a* may face or be in contact with the other surface of the extending area 93*b* of the second coupling member 190*b*.

While the display panel 110 is inserted into the main frame 130, the extending area 93*b* of the second coupling member 190*b* may be disposed between the extending area 93*a* of the first coupling member 190*a* and the support plate 170.

One surface of the extending area 93*b* of the second coupling member 190*b* may face or be in contact with the support plate 170. The other surface of the extending area 93*b* of the second coupling member 190*b* may be spaced apart from the inner plate 150. The other surface of the extending area 93*b* of the second coupling member 190*b* may face or be in contact with the other surface of the extending area 93*a* of the first coupling member 190*a*.

That is, the first coupling member 190*a* and the second coupling member 190*b* may be coupled in a hook manner. Accordingly, the display panel 110 may maintain a constant distance from the main frame 130. In addition, it is possible to prevent in advance a phenomenon in which a central area of the display panel 110 is inclined toward the front.

In addition, the inner plate 150 may include a plurality of bead shapes B. The bead shape B may protrude toward the display panel 110. Since the inner plate 150 includes the plurality of bead shapes B, the distance between the display panel 110 and the main frame 130 can be kept constant, and rigidity can be secured.

Referring to FIG. 11 (*a*), a first coupling member 191*a* may be formed to be long in the horizontal direction on the support plate 170. A second coupling member 191*b* may be formed to be long in the horizontal direction on the inner plate 150 corresponding to the first coupling member 191*a*.

The first coupling member 191*a* may have a substantially same horizontal length as the second coupling member 191*b*. Alternatively, the first coupling member 191*a* may have a different horizontal length from the second coupling member 191*b*.

Since the first coupling member 191*a* and the second coupling member 191*b* are formed to be long in the horizontal direction, the display panel 110 can more stably maintain a constant distance from the main frame 130. In addition, since the first coupling member 191*a* and the second coupling member 191*b* are fastened to be long in the horizontal direction, it is possible to more effectively prevent a phenomenon in which the central area of the display panel 110 is inclined toward the front.

Referring to FIG. 11(*b*), first coupling members 192*a*1 and 192*a*2 may be formed to be long in the vertical direction on the support plate 170. A plurality of first coupling members 192*a*1 and 192*a*2 may be formed. The plurality of first coupling members 192*a*1 and 192*a*2 may be spaced apart in the horizontal direction. Second coupling members 192*b*1 and 192*b*2 may be formed to be long in the vertical direction on the inner plate 150 corresponding to the first coupling members 192*a*1 and 192*a*2. A plurality of second coupling members 192*b*1 and 192*b*2 may be formed. The plurality of second coupling members 192*b*1 and 192*b*2 may be spaced apart in the horizontal direction.

The first coupling members 192*a*1 and 192*a*2 may have a substantially same vertical length as the second coupling members 192*b*1 and 192*b*2. Alternatively, the first coupling members 192*a*1 and 192*a*2 may have a different vertical length from the second coupling members 192*b*1 and 192*b*2.

Since the first coupling members 192*a*1 and 192*a*2 and the second coupling members 192*b*1 and 192*b*2 are formed to be long in the vertical direction, the display panel 110 can more stably maintain a constant distance from the main frame 130. In addition, since the first coupling member 192*a*1 and 192*a*2 and the second coupling member 192*b*1 and 192*b*2 are fastened to be long in the vertical direction, in addition to preventing the display panel 110 from moving left and right in advance, it is possible to more effectively prevent a phenomenon in which the central area of the display panel 110 is inclined toward the front.

Referring to FIG. 11 (*c*), first coupling members 193*a*1 and 193*a*2 may be formed to be long in the diagonal direction on the support plate 170. A plurality of first coupling members 193*a*1 and 193*a*2 may be formed. The plurality of first coupling members 193*a*1 and 193*a*2 may be spaced apart in the horizontal direction. A distance between the first coupling members 193*a*1 and 193*a*2 may gradually increase as it proceeds from the top to the bottom. Second coupling members 193b1 and 193b2 may be formed to be long in the diagonal direction on the inner plate 150 corresponding to the first coupling members 193a1 and 193a2. A plurality of second coupling members 193b1 and 193b2 may be formed. The plurality of second coupling members 193b1 and 193b2 may be spaced apart in the horizontal direction. A distance between the second coupling members 193b1 and 193b2 may gradually increase as it proceeds from the top to the bottom.

Since the first coupling members 193a1 and 193a2 and the second coupling members 193b1 and 193b2 are formed in the diagonal direction, the display panel 110 can be fastened to the main frame 130 at a correct position. In addition, since the first coupling members 193a1 and 193a2 and the second coupling members 193b1 and 193b2 are fastened in the diagonal direction, it is possible to more stably maintain a constant distance.

Referring to FIG. 12 (a), a first coupling member 194a may include a fastening area 91c fastened to the support plate 170 and an extending area 93c extended from one side of the fastening area 91c.

A second coupling member 194b may include a fastening area 91d fastened to the inner plate 150, a protruding area 92d that is bent and protrudes from one side of the fastening area 91d, and an extending area 93d that is bent and extended from the protruding area 92d.

The extending area 93c of the first coupling member 194a may be inserted and fastened between the fastening area 91d of the second coupling member 194b and the extending area 93d of the second coupling member 194b.

An upper surface of the extending area 93c of the first coupling member 194a may face or be in contact with a lower surface of the extending area 93d of the second coupling member 194b. A lower surface of the extending area 93c of the first coupling member 194a may face or be in contact with an upper surface of the fastening area 91d of the second coupling member 194b.

Referring to FIG. 12 (b), a first coupling member 195a may include a fastening area 91e fastened to the support plate 170 and a bending area 92e protruding and being bent from the fastening area 91e.

A second coupling member 195b may include a fastening area 91f fastened to the inner plate 150 and a bending area 92f protruding and being bent from the fastening area 91f.

The bending area 92e of the first coupling member 195a may be disposed between the bending area 92f of the second coupling member 195b and the inner plate 150. One surface of the banding area 92e of the first coupling member 195a may face or be in contact with the inner plate 150. The other surface of the bending area 92e of the first coupling member 195a may face or be in contact with the other surface of the bending area 92f of the second coupling member 195b.

The bending area 92f of the second coupling member 195b may be disposed between the bending area 92e of the first coupling member 195a and the support plate 170. One surface of the bending area 92f of the second coupling member 195b may face or be in contact with the support plate 170. The other surface of the bending area 92f of the second coupling member 195b may face or be in contact with the other surface of the bending area 92e of the first coupling member 195a.

Referring to FIGS. 13 to 15, a display device 300 may include the display panel 110, a main frame 330 and an inner plate 350.

The display panel 110 is provided on a front surface of the display device 300 and can display images.

The main frame 330 may be disposed behind the display panel 110. The main frame 330 may be coupled to the display panel 110. In order for the main frame 330 to be coupled to the display panel 110, the main frame 330 and/or other structures adjacent thereto may include a protruding part, a sliding part, a coupling part, and the like.

An edge of the main frame 330 may be bent at least once toward the outside.

The main frame 330 may include a bottom frame 331. The bottom frame 331 may be disposed under the main frame 330. The bottom frame 331 may be separated from or coupled to the main frame 330. The main frame 330 and the bottom frame 331 may cover the side surfaces of the display panel 110.

The inner plate 350 may be disposed behind the display panel 110. The inner plate 350 may be disposed between the display panel 110 and the main frame 330. A front surface of the inner plate 350 may face the display panel 110. A rear surface of the inner plate 350 may be fastened to the main frame 330.

The inner plate 350 may face the support plate 170 mounted on the back surface of the display panel 110. The inner plate 350 may be connected to or coupled to the support plate 170 through coupling members 351 and 353.

The coupling members 351 and 353 may couple the inner plate 350 to the support plate 170. The coupling members 351 and 353 may be disposed on the front surface of the inner plate 350.

The coupling members 351 and 353 may include magnetic members 351 and 351a having magnetism and adhesive members 353 and 353a coated with adhesive. For example, the magnetic members 351 and 351a may be magnets, and the adhesive members 353 and 353a may be double-sided tapes.

The magnetic members 351 and 351a may be disposed in an upper area of the inner plate 350. The adhesive members 353 and 351a may be disposed in a lower area of the inner plate 350.

When the display panel 110 is separated from the inner plate 350, a manager can detach it while pulling an upper part of the display panel 110. By arranging the magnetic members 351 and 351a having lower adhesive strength than the adhesive members 353 and 351a in the upper area of the inner plate 350, the manager can more easily separate the display panel 110 from the inner plate 350.

A plurality of magnetic members 351 and 351a may be arranged in M rows and N columns (M and N are natural numbers) in the upper area of the inner plate 350. The number of the magnetic members 351 disposed in the first row may be different from the number of the magnetic members 351a disposed in the remaining rows except the first row. For example, the number of the magnetic members 351 disposed in the first row may be greater than the number of the magnetic members 351a disposed in the remaining rows except the first row.

That is, the number of the magnetic members 351 disposed close to an upper border or edge of the display panel 110 is greater than the number of the magnetic members 351a disposed in the central area of the display panel 110, so that it is possible to prevent in advance the border of the display panel 110 and a border of the inner plate 350 from being randomly separated.

A plurality of adhesive members 353 may be disposed to be horizontally long in the lower area of the inner plate 350. The plurality of the adhesive members 353 may be spaced apart in the horizontal direction. The plurality of the adhesive members 353 are disposed in the lower area of the inner plate 350, so that it is possible to prevent in advance the border of the display panel 110 and the border of the inner plate 350 from being randomly separated.

In addition, the display device 300 may prevent the display panel 110 from slipping on the inner plate 350 by a shearing force (force applied in a direction parallel to the front surface or back surface of the display panel).

Referring to FIG. 16, the plurality of magnetic members 351 may be arranged in M rows and N columns (M and N are natural numbers) in the upper area of the inner plate 350. The number of the magnetic members 351 disposed in the first row may be different from the number of the magnetic members 351b disposed in the remaining rows except the first row. For example, the number of the magnetic members 351 disposed in the first row may be greater than the number of the magnetic members 351b disposed in the remaining rows except the first row.

That is, the number of the magnetic members 351 disposed close to an upper border or edge of the display panel 110 is greater than the number of the magnetic members 351a disposed in the central area of the display panel 110, so that it is possible to prevent in advance the border of the display panel 110 and the border of the inner plate 350 from being randomly separated.

A plurality of adhesive members 353b1 and 353b2 may be disposed to be vertically long in the lower area of the inner plate 350. The plurality of adhesive members 353b1 and 353b2 may be spaced apart in the horizontal direction. The display device 300 arranges vertically the plurality of adhesive members 353b1 and 353b2 in the lower area of the inner plate 350, so that it is possible to easily separate the display panel 110 from the inner plate 350. That is, the adhesive members 353b1 and 353b2 is disposed to be long in the same vertical direction as the direction in which the display panel 110 and the inner plate 350 are separated, so that it is possible to have a lower adhesive force than the adhesive members 353b1 and 353b2 disposed in the horizontal direction. Accordingly, the administrator can more easily separate the display panel 110 from the inner plate 350.

The plurality of adhesive members 353b1 and 353b2 may adjust the adhesive force by varying the width or materials from neighboring adhesive members 353b1 and 353b2.

In addition, the display device 300 may prevent the display panel 110 from slipping on the inner plate 350 by the shearing force.

Referring to FIG. 17, a plurality of magnetic members 351c may be arranged in M rows and N columns (M and N are natural numbers) in the upper area of the inner plate 350.

The magnetic member 351c may form a relatively large area of the magnetic member 351c to increase adhesion. At this time, a separation distance b between the magnetic members 351c may be shortened. For example, when it is assumed that the separation distance between the magnetic members 351c shown in FIG. 17 is a second separation distance b, and the separation distance between the magnetic members 351 shown in FIG. 16 is a first separation distance a, the second separation distance b may be shorter than the first separation distance a.

An adhesive member 353c may be disposed to be long in the horizontal direction in the lower area of the inner plate 350.

Referring to FIGS. 18 to 20, the coupling member may connect or fasten the display panel 110 and the inner plate 350 with only magnetic members 351d, 351e, and 351f.

The plurality of the magnetic members 351d and 351e may be arranged in M rows and N columns (M and N are natural numbers) on the inner plate 350.

As a size or area of one magnetic member 351d, 351e, 351f increases, a separation distance between the magnetic members 351d, 351e, 351f may become shorter.

Referring to FIG. 21, the magnetic members 351 may relatively thickly form thicknesses th1 and th2 of the magnetic members 351 to increase adhesion. For example, the thickness of the magnetic member 351 shown in FIG. 21 (a) may be referred to as a first thickness th1, and the thickness of the magnetic member 351 shown in FIG. 21 (b) may be referred to as a second thickness th2.

The first thickness th1 may be substantially the same as the thickness of the magnetic member shown in FIGS. 13 to 20. The second thickness th2 may be formed to be thicker than the first thickness th1. Thus, since the magnetic member 351 may contain more magnetic material as the thickness increases, adhesion may be improved.

As described above so far, the coupling members 351 and 353 may adjust magnetic force or adhesive force by using the spacing between the magnetic members 351, the thickness of the magnetic member 351, and the area of the magnetic member 351.

Looking at FIGS. 22 and 23, the adhesive member 353 may include at least one layer.

The adhesive member 353 may include a first layer 3a to a seventh layer 3g.

The first layer 3a may be a protective layer. The first layer 3a may protect a second layer 3b.

The second layer 3b may be stacked on a top surface of the first layer 3a. The second layer 3b may be an adhesive layer.

A third layer 3c may be stacked on a top surface of the second layer 3b. The third layer 3c may be a PET film.

A fourth layer 3d may be stacked on a top surface of the third layer 3c. The fourth layer 3d may be PU foam.

A fifth layer 3e may be stacked on a top surface of the fourth layer 3d. The fifth layer 3e may be a PET film or TPU.

A sixth layer 3f may be stacked on a top surface of the fifth layer 3e. The sixth layer 3f may be an adhesive layer.

The seventh layer 3g may be stacked on a top surface of the sixth layer 3f. The seventh layer 3g may be an adhesive layer. The seventh layer 3g may be a protective layer. The seventh layer 3g may protect the sixth layer 3f.

The adhesive members 353b1 and 353b2 may form a PET film having good adhesion between the second layer 3b and the fourth layer 3d and between the fourth layer 3d and the sixth layer 3f. Thus, a PET film having good adhesion may be disposed between the adhesive layer and the PU foam, so that residues of the PU foam separated from both adherends (the display panel 110 and the inner plate 350) can be easily removed.

Certain embodiments or other embodiments of the present disclosure described above are not mutually exclusive or distinct from each other. The certain embodiments or other embodiments of the present disclosure described above may be used together or combined with each other in configuration or function.

The above detailed description should not be construed in all aspects as limiting and should be considered illustrative. The scope of the present disclosure should be determined by rational interpretation of the appended claims, and all variations within the scope of equivalents of the present disclosure are included in the scope of the present disclosure.

What is claims is:

1. A display device comprising:
a display panel;
a plate disposed at a rear of the display panel;
a main frame positioned at a rear of the plate;

a coupling member disposed between the main frame and the plate; and a bottom frame coupled to a lower part of the main frame, wherein the coupling member includes:

a first coupling member mounted on a rear of the plate; and a second coupling member configured to be coupled to the first coupling member, wherein the first coupling member comprises a lower protrusion portion extending rearward from the plate, wherein the second coupling member comprises an upper protrusion portion extending forward and configured to contact the lower protrusion portion to engage the first and second coupling members, wherein the main frame includes a guide member which is disposed at an outer area of the lower part of the main frame, and the bottom frame includes a guide bar which is disposed at an outer area of an upper part of the bottom frame to correspond to the guide member.

2. The display device of claim 1, wherein the first coupling member includes:

a fastening area fastened to the plate;

a protruding area extending at an angle from one end of the fastening area; and an extending area extending at an angle from the protruding area, and wherein the second coupling member includes:

a fastening area fastened to an inner plate disposed between the display panel and the main frame;

a protruding area extending at an angle from one end of the fastening area, and an extending area extending at an angle from the protruding area.

3. The display device of claim 2, wherein the extending area of the first coupling member is disposed between the inner plate and the extending area of the second coupling member, and the extending area of the second coupling member is disposed between the plate and the extending area of the first coupling member.

4. The display device of claim 3, wherein the first coupling member and the plate are attached by an adhesive, and the second coupling member and the inner plate are attached by an adhesive.

5. The display device of claim 2, wherein a plurality of the first and second coupling members are aligned along a vertical direction, a horizontal direction, or a diagonal direction.

6. The display device of claim 1, wherein a protrusion of the guide bar is configured to be inserted into and coupled to a groove of the guide member.

7. The display device of claim 1, wherein the main frame comprises bent portions at edges thereof except for a lower portion of the main frame.

8. The display device of claim 7, wherein the bent portions of the edges of the main frame and the bottom frame form an outer surface of the display device.

9. The display device of claim 7, wherein the main frame includes:

a body;

a first long side at an upper side of the body;

a first short side at a right side of the body;

a second short side at a left side of the body; and a second long side comprising an inwardly cut-out portion, wherein the first long side includes a first wall extending from the upper side of the body and a second wall extending from an upper side of the first wall, the first short side includes a third wall extending from the right side of the body and a fifth wall extending from a right side of the third wall, and the second short side includes a fourth wall extending from the left side of the body and a sixth wall extending from a right side of the fourth wall.

10. The display device of claim 9, wherein the first wall, the third wall, and the fourth wall are bent at the body, and the second wall, the fifth wall, and the sixth wall are bent at the first wall, the third wall, and the fourth wall, respectively, to face the body.

11. The display device of claim 10, wherein a right side of the first wall is in contact with an upper side of the third wall, a right side of the second wall is in contact with an upper side of the fifth wall, a left side of the first wall is in contact with an upper side of the fourth wall, and a left side of the second wall is in contact with an upper side of the sixth wall.

12. The display device of claim 7, wherein:

the main frame comprises a pair of first fastening members respectively disposed on both sides of the lower side of the main frame and each protruding from a rear of the main frame, and a second fastening member disposed between the pair of first fastening members and comprising a raised area to define an inner space thereunder.

13. The display device of claim 12, wherein the bottom frame comprises:

a pair of third fastening members respectively disposed on both sides of an upper part of the bottom frame to respectively correspond to the pair of first fastening members, and a fourth fastening member disposed between the pair of third fastening members to correspond to the second fastening member, wherein the fourth fastening member extends from the bottom frame and is configured to be inserted into the inner space of the second fastening member.

14. The display device of claim 7, wherein the display panel is capable of being inserted and secured in the main frame through the lower portion of the main frame.

15. A display device comprising:

a display panel;

a first plate disposed at a rear of the display panel;

a main frame positioned at a rear of the first plate;

a coupling member disposed between the main frame and the first plate; and a bottom frame coupled to the lower portiona lower part of the main frame, wherein the coupling member includes:

a first coupling member mounted at a rear of the first plate; and a second coupling member configured to be coupled to the first coupling member, wherein the second coupling member comprises a downward extending protrusion configured to hook downward onto the first coupling member to secure the first and second coupling members together, wherein the main frame includes a guide member which is disposed at an outermost outer area of the lower part of the main frame, and the bottom frame includes a guide bar which is disposed at an outermost outer area of an upper part of the bottom frame to correspond to the guide member.

16. The display device of claim 15, further comprising a second plate disposed between the first plate and the main frame, wherein the second coupling member is mounted at a front surface of the second plate.

17. The display device of claim 15, wherein the first coupling member is attached to the first plate via an adhesive member.

* * * * *